US009929345B1

United States Patent
Lu et al.

(10) Patent No.: US 9,929,345 B1
(45) Date of Patent: *Mar. 27, 2018

(54) CURABLE POLYMERIC MATERIALS AND THEIR USE FOR FABRICATING ELECTRONIC DEVICES

(71) Applicant: Flexterra, Inc., Skokie, IL (US)

(72) Inventors: Shaofeng Lu, Wilmette, IL (US); Damien Boudinet, Zhubei (TW); Yuqing Xia, Northbrook, IL (US); Wei Zhao, Skokie, IL (US); Antonio Facchetti, Chicago, IL (US)

(73) Assignee: Flexterra, Inc., Skokie, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/250,918

(22) Filed: Aug. 30, 2016

Related U.S. Application Data

(63) Continuation of application No. 14/798,443, filed on Jul. 13, 2015, now Pat. No. 9,431,234, which is a
(Continued)

(51) Int. Cl.
*H01L 21/02* (2006.01)
*H01L 21/445* (2006.01)
(Continued)

(52) U.S. Cl.
CPC .... *H01L 51/0034* (2013.01); *H01L 21/02118* (2013.01); *H01L 21/02282* (2013.01); *H01L 21/445* (2013.01); *H01L 23/293* (2013.01); *H01L 23/3178* (2013.01); *H01L 29/4908* (2013.01); *H01L 29/7869* (2013.01); *H01L 51/052* (2013.01); *H01L 51/107* (2013.01)

(58) Field of Classification Search
CPC .......................................................... H01L 21/02
USPC ............................... 438/99, 781, 104; 257/40
See application file for complete search history.

(56) References Cited

U.S. PATENT DOCUMENTS

| 5,468,819 A | 11/1995 | Goodall et al. ............... 526/171 |
| 7,820,355 B2 | 10/2010 | Kurakata ................... 430/270.1 |

(Continued)

FOREIGN PATENT DOCUMENTS

WO 2011/108533 9/2011

OTHER PUBLICATIONS

Abadie et al., "New catalysts for linear polydicyclopentadiene synthesis," *European Polymer Journal*, 36: 1213-1219 (2000).
(Continued)

*Primary Examiner* — Duc Truong
(74) *Attorney, Agent, or Firm* — McDonnell Boehnen Hulbert & Berghoff LLP

(57) ABSTRACT

Disclosed are curable linear polymers that can be used as active and/or passive organic materials in various electronic, optical, and optoelectronic devices. In some embodiments, the device can include an organic semiconductor layer and a dielectric layer prepared from such curable linear polymers. In some embodiments, the device can include a passivation layer prepared from the linear polymers described herein. The present linear polymers can be solution-processed, then cured thermally (particularly, at relatively low temperatures) and/or photochemically into various thin film materials with desirable properties.

12 Claims, 7 Drawing Sheets

Related U.S. Application Data continuation of application No. 13/742,867, filed on Jan. 16, 2013, now Pat. No. 9,082,981.

(60) Provisional application No. 61/586,999, filed on Jan. 16, 2012.

(51) Int. Cl.

| | | |
|---|---|---|
| *H01L 51/05* | (2006.01) | |
| *H01L 51/00* | (2006.01) | |
| *H01L 51/10* | (2006.01) | |
| *H01L 29/786* | (2006.01) | |
| *H01L 29/49* | (2006.01) | |
| *H01L 23/29* | (2006.01) | |
| *H01L 23/31* | (2006.01) | |

(56) References Cited

U.S. PATENT DOCUMENTS

| | | | |
|---|---|---|---|
| 8,105,870 B2 | 1/2012 | Masuda | 438/99 |
| 8,334,456 B2 | 12/2012 | Zhu et al. | 136/263 |
| 8,598,449 B2 | 12/2013 | Pan et al. | 136/263 |
| 8,598,450 B2 | 12/2013 | Pan et al. | 136/263 |
| 8,748,739 B2 | 6/2014 | Zhu et al. | 136/263 |
| 9,082,981 B1 * | 7/2015 | Lu | H01L 51/052 |
| 9,431,234 B1 * | 8/2016 | Lu | H01L 21/02118 |
| 2012/0056183 A1 | 3/2012 | Mueller et al. | 257/57 |
| 2012/0056249 A1 | 3/2012 | Mueller et al. | 257/288 |
| 2012/0088879 A1 | 4/2012 | Yoshiwara | 524/554 |

OTHER PUBLICATIONS

Dall'Asta et al., "Homopolymerization of Dicyclopentadiene Induced by Ziegler-Natta Catalysts and by other Transition Metal Systems," *Die Makromolekulare Chemie*, 130: 153-165 (1969).

Marshall et al., "A Novel, Metal Alkyl-Free Catalyst for the Ring-Opening Polymerization of Cyclo-Olefins," *European Polymer Journal*, 5: 29-33 (1969).

Pacreau et al., "Linear polymerization of endo-dicyclopentadiene initiated by metathesis catalysts," *Makromol. Chem.*, 188: 2585-2595 (1987).

* cited by examiner a)

b)

CURABLE POLYMERIC MATERIALS AND THEIR USE FOR FABRICATING ELECTRONIC DEVICES

CROSS REFERENCE TO RELATED APPLICATIONS

This application is a continuation of U.S. patent application Ser. No. 14/798,443, filed on Jul. 13, 2015, now U.S. Pat. No. 9,431,234, which is a continuation of U.S. patent application Ser. No. 13/742,867, filed on Jan. 16, 2013, now U.S. Pat. No. 9,082,981, which claims priority to and the benefit of U.S. Provisional Patent Application Ser. No. 61/586,999, filed on Jan. 16, 2012, the disclosure of each of which is incorporated by reference herein in its entirety.

INTRODUCTION

In the past decade, there has been a growing interest in developing electronic devices using organic or amorphous materials as the semiconductor component. These devices can offer advantages such as structural flexibility, potentially much lower manufacturing costs, and the possibility of low-temperature ambient manufacturing processes on large areas. For example, both organic and amorphous materials can be used to enable new devices such as electronic paper, flexible organic light-emitting diodes (OLEDs), and radio-frequency identification (RFID) technologies.

One of the key benefits to using organic and amorphous materials is the potential to use solution-phase deposition techniques, although the latter also can be deposited using various vapor-phase approaches. Yet, to fully realize the processing advantages of organic or amorphous semiconductors, all active components of the device should be mechanically flexible and preferably, most of the components of the device should be compatible with, if not processable by, solution-phase deposition fabrication.

For example, thin-film transistors (TFTs) based upon various solution-processed organic semiconductors as well as solution-processed or vapor-deposited metal oxide semiconductors have been developed. However, a critical component in TFTs is the dielectric layer, which serves as the gate electrical insulator material. In addition to exhibiting low-gate leakage properties, a good dielectric material also need to be air and moisture-stable, and should be robust enough to withstand various conditions that are common in device fabrication processes, with properties that are tunable depending on the type of semiconductor employed in the TFT channel. Furthermore, to enable a robust fabrication process and stable device operation, optimization of the multilayer TFT structure by using appropriate material combinations is necessary. Thus, the substrate surface should be treated or coated to be compatible with the overlying layers fabricated on top of it. The semiconductor (the layer within which charge transport occurs) needs to be uniformly deposited. If the semiconductor is inorganic, amorphous materials usually are employed; and if the semiconductor is organic, additives typically are used in the formulation to facilitate coating. In addition, after the device is completed, a top layer often is used to protect the TFT stack from the environment during operation.

Accordingly, there is a desire in the art to design and synthesize new organic materials that are compatible with diverse substrates, metallic contacts, and/or semiconductor materials such that they could be employed in the whole TFT fabrication process to meet one or more device requirements including low current leakage densities, tuned surface energies, good adhesion, good solution-processability, and/or low permeation to water.

SUMMARY

In light of the foregoing, the present teachings provide organic materials that possess one or more desirable properties and characteristics which make them suitable as active (e.g., dielectric) and/or passive (e.g., passivation or surface-modifying) materials in an electronic device such as a field-effect transistor.

More specifically, the present organic materials are based upon a linear polymer that can be deposited from a solution, then curable into a physically robust and ambient-stable thin film. In various embodiments, the linear polymer can comprise a repeating unit of formula (A):

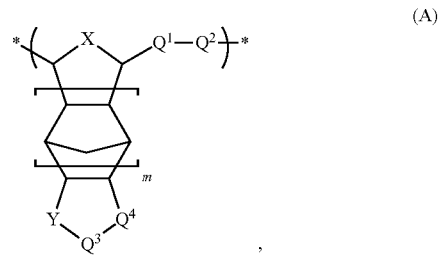

(A)

wherein:
X can be selected from the group consisting of —$CH_2$—, —CHR—, —$CR_2$—, —C(O), —$SiH_2$—, —SiHR—, —$SiR_2$—, —NH—, —NR—, —O— and —S—;
Y can be absent or selected from the group consisting of —$CH_2$—, —CHR—, —$CR_2$—, —C(O), —$SiH_2$—, —SiHR—, —$SiR_2$—, —NH—, —NR—, —O— and —S—;
$Q^1$-$Q^2$ and $Q^3$-$Q^4$ each independently can be a crosslinkable moiety;
R can be selected from the group consisting of a halogen, —$OR^3$, —C(O)$OR^3$, —OC(O)$R^3$, —$NR^4R^5$, —C(O)$NR^4R^5$, —OC(O)$NR^4R^5$, a $C_{1-10}$ alkyl group, a $C_{1-10}$ haloalkyl group, and an optionally substituted aryl or heteroaryl group, where $R^3$ is a $C_{1-10}$ alkyl group or a —Si($C_{1-10}$ alkyl)$_3$ group, and $R^4$ and $R^5$ independently are H or a $C_{1-10}$ alkyl group; and
m is 0, 1 or 2.

The present teachings also provide organic materials comprising uncured or cured films of the linear polymer described herein, compositions that can be used to prepare the organic materials using a solution-phase process, as well as electronic devices that include the organic materials.

Methods for preparing the linear polymers, the organic materials comprising the linear polymers, and electronic devices that incorporate the organic materials also are provided and are within the scope of the present teachings.

The foregoing as well as other features and advantages of the present teachings will be more fully understood from the following figures, description, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
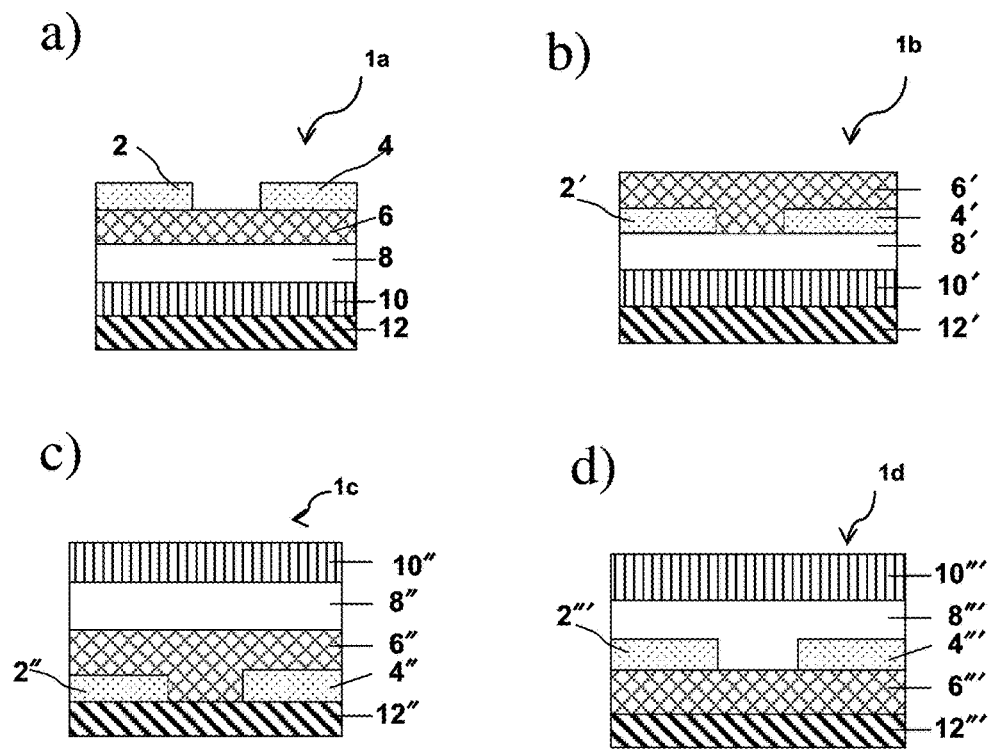
FIG. 1 illustrates four different configurations of thin film transistors: a) bottom-gate top contact, b) bottom-gate bottom-contact, c) top-gate bottom-contact, and d) top-gate top-contact; each of which can be used to incorporate one or more linear polymers of the present teachings as active and/or passive materials.

The present teachings relate to organic materials that can be used as active and/or passive materials in a wide variety of electronic, optical, and optoelectronic devices such as thin film transistors (TFTs), specifically, organic field-effect transistors (OFETs), semiconductor oxide field-effect transistor (SOFETs), as well as sensors, capacitors, unipolar circuits, complementary circuits (e.g., inverter circuits), and the like.

Generally, the present organic materials are prepared from a linear polymer comprising a repeating unit that includes at least two unsaturated bonds, where a first unsaturated bond is provided by a polycyclic moiety and a second unsaturated bond extraneous of the polycyclic moiety forms part of the backbone of the linear polymer. Such a linear polymer can be solution-processed into thin films, where the thin films subsequently can be cured (thermally and/or photochemically) into physically robust and ambient-stable active or passive materials suitable for use in various electronic, optical, and optoelectronics devices. For example, the organic materials according to the present teachings can be used (either by itself or with at least one other dielectric material) as the dielectric layer in a thin film transistor, as an etch-stop/blocking/passivation/encapsulation/barrier material (for example, to encapsulate the source and drain electrodes in a transistor), as an interfacial material (for example, a surface-modifying interlayer), or as a component in the semiconductor layer.

When used as a dielectric material, the present organic materials can exhibit a wide range of desirable properties and characteristics including, but not limited to, low leakage current densities, high breakdown voltages, low hysteresis, tuned capacitance values, uniform film thickness, solution-processability, fabricability at low temperatures and/or atmospheric pressures, air and moisture stability, and/or compatibility with diverse gate materials and/or semiconductors. When used as passivation or interfacial materials, the present organic materials can exhibit desirable properties and characteristics including, but not limited to, high glass transition temperature, high optical clarity, low shrinkage, low moisture absorption, low oxygen penetration, uniform film thickness, solution-processability, fabricability at low temperatures and/or atmospheric pressures, and good adhesion to adjacent materials.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), butyl (e.g., n-butyl, iso-butyl, sec-butyl, tert-butyl), and hexyl groups. In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_zH_{2z+1-t}X^0{}_t$, where $X^0$, at each occurrence, is F, Cl, Br or I, z is an integer in the range of 1 to 40, and t is an integer in the range of 1 to 81, provided that t is less than or equal to $2z+1$. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cyclic" refers to an organic closed-ring group including cycloalkyl groups, aryl groups, cycloheteroalkyl groups, and heteroaryl groups as defined herein.

As used herein, "cycloalkyl" refers to a non-aromatic carbocyclic group including cyclized alkyl, cyclized alkenyl, and cyclized alkynyl groups. In various embodiments, a cycloalkyl group can have 3 to 40 carbon atoms (i.e., $C_{3-40}$ cycloalkyl group), for example, 3 to 20 carbon atoms. A cycloalkyl group can be monocyclic (e.g., cyclohexyl) or polycyclic (e.g., containing fused, bridged, and/or spiro ring systems), where the carbon atoms are located inside the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 40 ring atoms (i.e., 3-40 membered cycloheteroalkyl group), for example, 3 to 20 ring atoms. One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 40 carbon atoms in its ring system, which can include multiple fused rings. In some embodiments, a polycyclic aryl group can have from 8 to 40 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 40 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

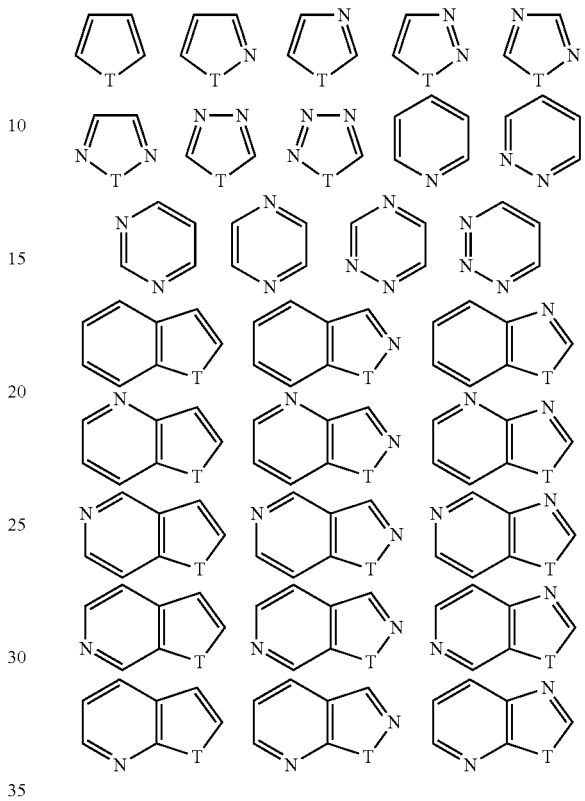

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

At various places in the present specification, substituents on a chemical group are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, a "dielectric material" has a conductivity in the order of $10^{-6}$ Scm$^{-1}$ or less to avoid current leakage to an adjacent electrical conductor.

It will be understand that when two components are described as being coupled to each other, the two components can be directly in contact (e.g., directly coupled to each other), or the two components can be coupled to each other via one or more intervening components or layers.

Throughout the specification, a specific stereoisomer may be presented when multiple stereoisomers are possible. In such cases, the specific stereoisomer presented should be understood to represent the different possible stereoisomers, unless explicitly stated otherwise. For example, a depiction of a cis-isomer should be understood to represent both the cis- and the trans-isomers, and vice versa.

Linear polymers according to the present teachings generally comprise a repeating unit of formula (A):

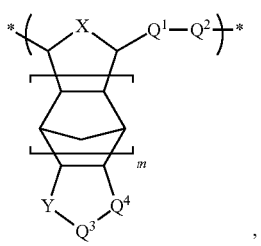

(A)

wherein:
X can be selected from the group consisting of —CH$_2$—, —CHR—, —CR$_2$—, —C(O), —SiH$_2$+, —SiHR—, —SiR$_2$—, —NH—, —NR—, —O— and —S—;
Y can be absent or selected from the group consisting of —CH$_2$—, —CHR—, —CR$_2$—, —C(O), —SiH$_2$—, —SiHR—, —SiR$_2$—, —NH—, —NR—, —O— and —S—;
Q$^1$-Q$^2$ and Q$^3$-Q$^4$ each independently can be a crosslinkable moiety;
R can be selected from the group consisting of a halogen, —OR$^3$, —C(O)OR$^3$, —OC(O)R$^3$, —NR$^4$R$^5$, —C(O)NR$^4$R$^5$, —OC(O)NR$^4$R$^5$, a C$_{1-10}$ alkyl group, a C$_{1-10}$ haloalkyl group, and an optionally substituted aryl or heteroaryl group, where R$^3$ is a C$_{1-10}$ alkyl group or a —Si(C$_{1-10}$ alkyl)$_3$ group, and R$^4$ and R$^5$ independently are H or a C$_{1-10}$ alkyl group; and
m is 0, 1 or 2.

In various embodiments, the present linear polymers can be obtained via ring-opening metathesis polymerization (ROMP) using a polycyclic monomer having at least two unsaturated bonds. More specifically, the polycyclic monomer typically comprises an optionally substituted norbornene moiety (or a heteroatom derivative thereof), which includes a first unsaturated bond, fused with at least one ring comprising a second unsaturated bond.

Monomers useful for preparing the present polymers can be represented by formula (B):

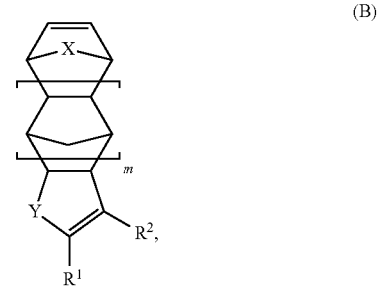

(B)

where R$^1$ and R$^2$ independently can be selected from the group consisting of H, a halogen, —OR$^3$, —C(O)OR$^3$, —OC(O)R$^3$, —NR$^4$R$^5$, —C(O)NR$^4$R$^5$, —OC(O)NR$^4$R$^5$, a C$_{1-10}$ alkyl group, a C$_{1-10}$ haloalkyl group, and an optionally substituted aryl or heteroaryl group; and
R$^3$, R$^4$, R$^5$, X, Y, and m are as defined herein.

In preferred embodiments, the present linear polymers can comprise a repeating unit of formula (II):

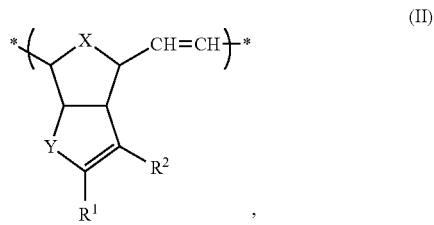

(II)

which polymers can be prepared from a monomer represented by formula (I):

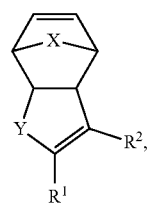

(I)

where R$^1$, R$^2$, X, and Y are as defined herein.

For example, in some embodiments, at least one of X and Y can be selected from —CHR—, —CR$_2$—, —C(O), —SiH$_2$—, —SiHR—, —SiR$_2$—, —NH—, —NR—, —O— and —S—; where R is as defined herein. In some embodiments, Y can be absent. In some embodiments, X can be O. In some embodiments, both X and Y can be —CH$_2$—.

In certain embodiments, monomers useful for preparing the present polymers can be represented by formula (Ia):

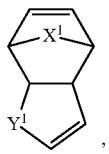
(Ia)

where $X^1$ and $Y^1$ independently can be selected from —CH$_2$—, —CHR—, —CR$_2$—, and —C(O); where R is as defined herein. In particular embodiments, at least one of $X^1$ and $Y^1$ is selected from —CHR—, —CR$_2$—, and —C(O); where R is as defined herein.

In certain embodiments, monomers useful for preparing the present polymers can be represented by formula (Ib):

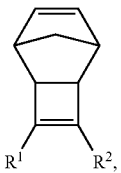
(Ib)

where $R^1$ and $R^2$ are as defined herein.

In certain embodiments, monomers useful for preparing the present polymers can be represented by formula (Ic):

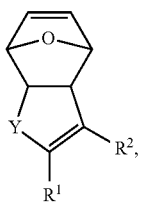
(Ic)

where Y can be absent or selected from —CH$_2$—, —CHR—, —CR$_2$—, and —C(O); and R, $R^1$ and $R^2$ are as defined herein.

To further illustrate, the present polymers can be prepared via selective ring-opening metathesis polymerization (ROMP) using, for example, one of the following monomers:

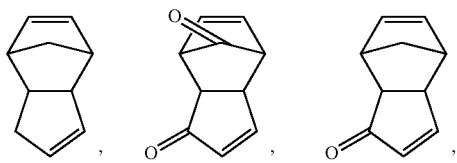

-continued

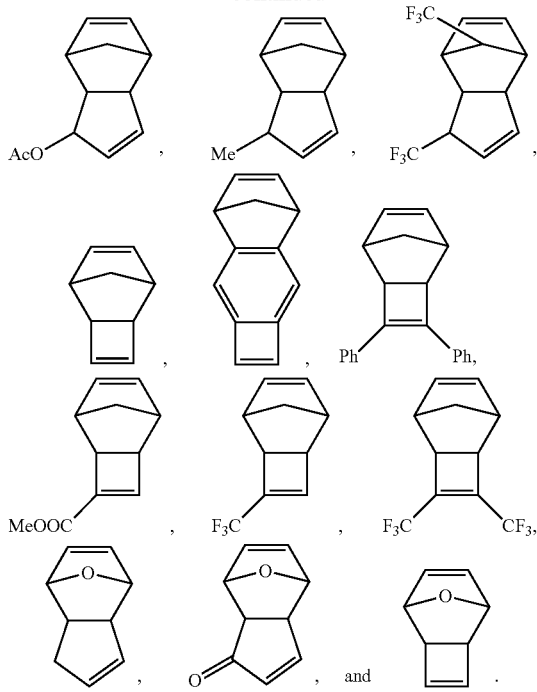

The above monomers either have been reported in the literature or can be prepared using procedures analogous to those that have been reported in the literature.

For example, various monomers of formula (Ib) can be prepared according to procedures known in the art. See e.g., *J. Org. Chem.*, 49(4): 596-604 (1984); *Org. Letts.*, 6(24): 4543-4546 (2004); and *Tetrahedron Letters*, 28(34): 3927-30 (1987), the entire disclosure of each of which is incorporated by reference herein for all purposes.

Additional embodiments of monomers of formula (Ib) can be prepared according to procedures described in *Chem. Letts.*, 36(9): 1162-1163 (2007); *Chem. Comm.*, 16:1755-1756 (1998); and *Chemische Berichte*, 111(4): 1264-1274 (1978), the entire disclosure of each of which is incorporated by reference herein for all purposes.

Further embodiments of monomers of formula (Ib) can be prepared via alkyne metathesis using procedures described in, for example, *Synlett*, 15: 2333-2336 (2003); *Angew. Chem.*, 106(6): 664-666 (1994); *Angew. Chem., Int. Ed. Engl.*, 33(6): 636-638 (1994); *J. Chem. Soc.*, 457-463 (1981); *J. Org. Chem.*, 76(16): 6591-6957 (2011); *European J. Org. Chem.*, 24: 4178-4192 (2008); *Org. Letts.*, 6(24): 4543-4546 (2004); and *J. Fluorine Chem.*, 73(1): 61-67 (1995); the entire disclosure of each of which is incorporated by reference herein for all purposes.

In addition to being polymerizable via ring-opening metathesis polymerization reaction, it should be noted that monomers falling within formula (I) also can undergo vinyl-addition polymerization as shown by the scheme below:

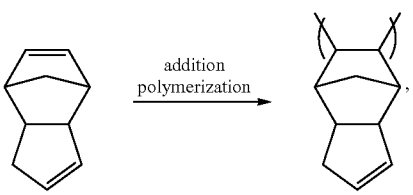

where the polymerization reaction is initiated by addition catalysts such as the organo nickel or palladium complexes described in U.S. Pat. No. 5,468,819. Despite being formed by the same or similar monomer, these addition polymers are structurally distinguishable over the linear polymers according to the present teachings, which are obtained via ring-opening metathesis polymerization (ROMP) reaction. Most notably, because of the different polymerization mechanism (due to the use of different catalysts/initiators), the linear polymers according to the present teachings always include unsaturated bonds in the backbone, while addition polymers do not.

To achieve the linear polymers of formula (A), selective ring-opening of the monomers described herein is required. More specifically, the ring-opening polymerization reaction needs to be limited to the norbornene ring only but not the other unsaturated ring fused thereto. The ring-opening polymerization of dicyclopentadiene has been studied extensively. For example, while certain ruthenium-based catalysts (Grubbs' catalysts) can lead to the ring-opening of both the norbornene and cyclopentene moieties thereby resulting in an insoluble crosslinked polymer having a structure such as:

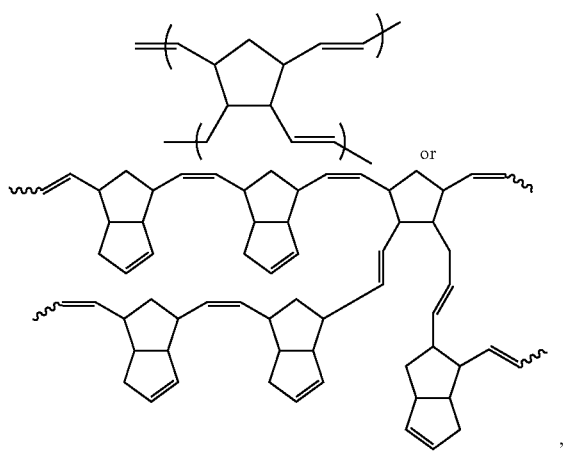

other catalysts and catalytic systems can be used to enable the selective ring-opening of the norbornene moiety only, thereby providing a soluble linear polymer of dicyclopentadiene (LPDCPD).

For example, a class of catalysts/catalytic systems that can be useful for preparing the linear polymers according to the present teachings is based upon the metal chloride ReCl$_5$. In *Makromol. Chem.*, 188: 2585-2595 (1987) (the entire disclosure of which is incorporated by reference herein for all purposes), it was reported that a soluble polymer was obtained in a 90% fraction of the product from the polymerization of endo-dicyclopentadiene (endo-DCPD) using ReCl$_5$ as the catalyst, and the addition of co-catalyst (CH$_3$)$_4$Sn led to both a much higher yield and a very pure soluble polymer product.

More recently, high molecular-weight linear polydicyclopentadienes (prepared from endo-DCPD) were obtained with catalytic systems derived from WCl$_6$ and WOCl$_4$ and organosilicon compounds. See *European Polymer Journal*, 36: 1213-1219 (2000), the entire disclosure of which is incorporated by reference herein for all purposes. Examples of these catalytic systems include WCl$_6$—SiAll$_4$, WOCl$_4$—SiAll$_4$, WOCl$_4$—SiMe$_2$All$_2$, and WCl$_6$—H$_2$O—SiMe$_2$All$_2$+H$_2$O/WCl$_6$ (All=allyl).

Additional useful catalysts/catalytic systems are described in *Makromol. Chem.*, 130: 153-165 (1969) and U.S. Pat. No. 5,198,511, the entire disclosure of each of which is incorporated by reference herein for all purposes.

Accordingly, using appropriate catalysts or catalytic systems known in the art such as, but not limited to, those explicitly described herein, monomers of formula (I) can be used to prepare linear polymers of formula (II) via selective ring-opening metathesis polymerization as depicted below:

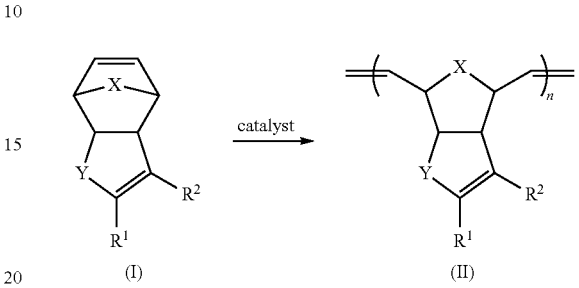

where X, Y, R$^1$ and R$^2$ are as defined herein, and n is an integer in the range of 5 to 500,000. In various embodiments, the present polymers can be high molecular weight polymers, where n is an integer in the range of 500 to 500,000.

In some embodiments, the present linear polymers can be end-functionalized with a photocrosslinkable group such as an acrylate group or a cinnamate group. For example, end-functionalized linear polymers according to the present teachings can be prepared by reacting the metal-carbene end group of the linear polymer with an acrylate via a selective Wittig-type reaction:

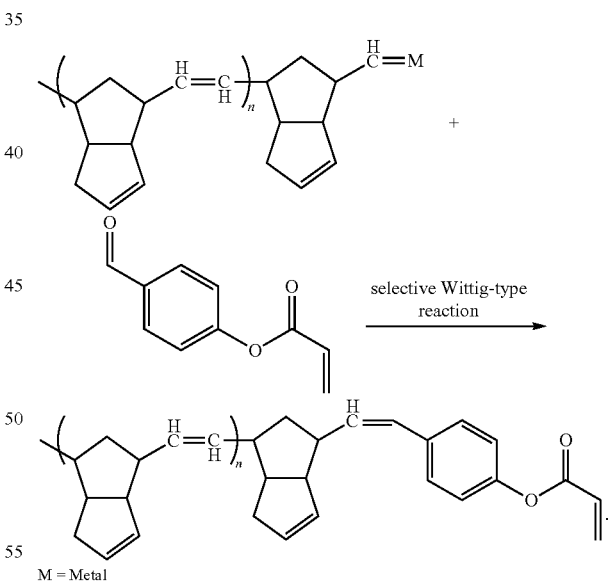

M = Metal

Additional acrylates suitable for end-functionalizing the present linear polymers are known in the art, including those described in International Publication No. WO 2010/136385, the entire disclosure of which is incorporated by reference herein for all purposes. The acrylate end group provides an additional mechanism for crosslinking, specifically, via click chemistry (such as thiol-ene coupling) or free radical additions that can be initiated by initiators with or without sensitizers. Examples of initiators and sensitizers are provided in International Publication No. WO 2010/136385. Chemistries and exemplary chemical groups for end-functionalizing ROMP polymers are described in, for example, Nature Chemistry, 1: 537 (2009), the entire disclosure of which is incorporated by reference herein for all purposes.

In some embodiments, the present linear polymers can include a co-monomer in addition to the monomer of formula (I). The co-monomer can be selected to increase the dielectric constant of the linear polymer. The resulting co-polymer can be either a random co-polymer or a block co-polymer:

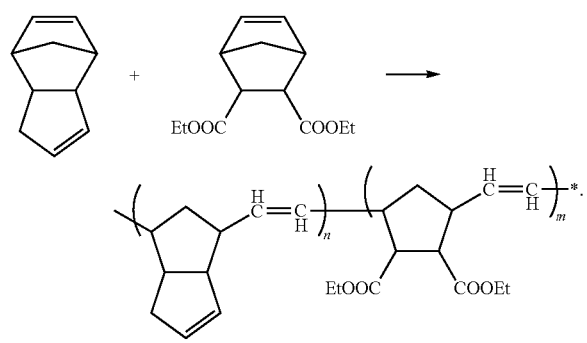

The co-monomer can be present in an amount of from about 0.01% to about 50% by weight, preferably from about 0.1% to about 20% by weight, more preferably from about 1% to about 10% by weight. In certain embodiments, such a co-polymer also can be end-functionalized with a crosslinkable acrylate group as described hereinabove:

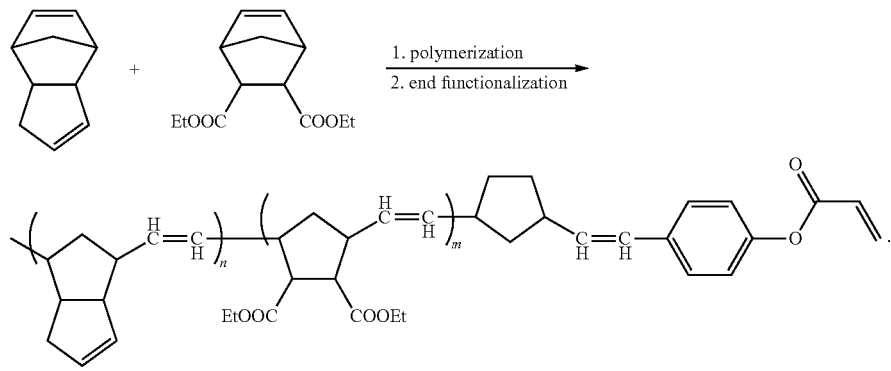

Prior to crosslinking, the optionally end-functionalized linear homopolymers and copolymers according to the present teachings generally are soluble in common organic solvents but can become significantly less soluble or insoluble in the same solvents after undergoing crosslinking. As used herein, a compound can be considered soluble in a solvent when at least 1 mg of the compound can be dissolved in 1 ml of the solvent. Compounds wherein less than 1 mg of the compound can be homogeneously dissolved in 1 ml of the solvent are considered insoluble.

More specifically, the present polymers (prior to crosslinking) can have satisfactory solubility in various common organic solvents, thereby affording formulations that are suitable for solution-phase processes. In certain embodiments, the present polymers can have satisfactory solubility in organic solvents that are orthogonal to those solvents (e.g., aromatic or polar chlorinated solvents) typically used to process common organic semiconducting molecules or polymers. This allows, for example, the fabrication of a solution-processed top-gate transistor, where the organic solvent used to dissolve the present polymers does not damage (i.e., dissolve, delaminate, swell, or otherwise physically disturb) or adversely affect the semiconducting properties of an underlying organic semiconductor material. Examples of organic solvents that can be used to formulate the present linear polymers include aliphatic hydrocarbons such as hexanes, cyclopentane, cyclohexane, n-nonane, n-decane, n-undecane, n-dodecane; alcohol solvents such as methanol, ethanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, anisole, phenetole, and veratrole; and amide solvents such as N-methylpyrrolidinone and dimethylacetamide. These solvents can be used either singly or in combination, or as mixtures with water.

Accordingly, the present polymers can be mobilized in a liquid medium to provide a composition (a coating formulation) for forming a thin film material. The composition can be a solution, a dispersion, a suspension, an emulsion, or a gel, although in most embodiments, the composition is a solution or a dispersion suitable for solution-phase processes. The liquid medium can include solid and/or gaseous components, that is, the liquid medium can be in a vapor or gaseous form. As such, the term "liquid medium" can include a vaporized liquid medium. The term "mobilized in a liquid medium" broadly means that the designated liquid medium causes a designated solid to take on properties of a liquid or vapor. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, a gel, or even micelles. As used herein, the term "solution" means that a substantial proportion of a designated solute has formed a single phase with a designated solvent, but a substantial solid, liquid and/or gaseous second phase that can include dispersed particulate matter also can be present.

In addition to the present polymers, the coating formulation can include other components that can be used to selectively modify certain properties such as the viscosity of the coating formulation, or the dielectric properties, thermal stability, and/or glass transition temperature of the film material to be formed. The coating formulation also can include initiators and/or sensitizers such as those described hereinabove to modify the crosslinkability of the present polymers. Accordingly, in some embodiments, the coating formulation can include one or more additives independently selected from viscosity modulators, detergents, dispersants, binding agents, compatibilizing agents, curing agents, initiators, sensitizers, humectants, antifoaming agents, wetting agents, pH modifiers, biocides, and bacteriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the coating formulation can include another linear dielectric polymer, a metal oxide, a silane crosslinker, an acrylate crosslinker, and/or combinations thereof, which can be used to prepare a blend dielectric material. For example, metal oxide fillers can be used to provide a higher dielectric constant. Fillers that have a high dielectric constant include metal oxides such as $SiO_2$, $Al_2O_3$, $TiO_2$, and the like; nitrides such as $Si_3N_4$; and paraelectric ceramic fillers such as barium titanate, strontium titanate, and lead zirconate.

As used herein, "solution-processable" or "solution-processed" refers to the ability of a compound, for example, the present polymers, to be processed via various solution-phase processes. A coating formulation comprising the present polymers can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, massprinting and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For noncontact printing techniques such as inkjet printing, the solubility requirement generally can be less stringent and a solubility range as low as about 1-4 mg/ml can suffice. For gravure printing, a higher solubility range may be necessary, often in the range of about 50-100 mg/ml. Other contact printing techniques such as screen-printing and flexo printing can require even higher solubility ranges, for example, about 100-1000 mg/ml The resulting film can take various forms including a wafer, a layer, a sheet, or an elongated web. Thin film materials based upon a polymer according to the present teachings can be monolithic (composed of a single homogenous layer) or can have multiple sublayers, where the multiple sublayers can have identical (homogeneous) or different (heterogeneous) chemical compositions.

In some embodiments, the present polymers can be thermally cured to provide improved properties such as increased glass transition temperature ($T_g$), which can lead to enhanced thermal stability, improved adhesion, and/or smoother interface with an adjacent material (e.g., a semiconductor material). Thermal crosslinking of the linear polymers can involve both the unsaturated bond present in the cyclic moiety as well as the unsaturated bond in the backbone of the polymer. However, without wishing to be bound to any particular theory, it is believed that most of the thermal crosslinking would involve the unsaturated bond in the cyclic moiety.

The present linear polymers can be thermally cured at different temperatures for various periods of time into a crosslinked material which is resistant to the mother solvent used to solution-process the linear polymer prior to thermal crosslinking. For example, the linear polymer can be deposited as a thin film which subsequently can be thermally cured in air or oxygen at a temperature of lower than or about 350° C., of lower than or about 300° C., at a temperature of lower than or about 200° C., at a temperature of lower than or about 180° C., at a temperature of lower than or about 150° C., at a temperature of lower than or about 140° C., or at a temperature of lower than or about 130° C., for as brief as about 8 minutes or less, and results in a physically robust crosslinked polymeric matrix with good interfacial properties suitable for further device processing such as patterning and subsequent solution-phase processes (e.g., to form/deposit overlying layers such as the semiconductor layer in a bottom-gate TFT structure or the gate layer for a top-gate TFT structure).

In some embodiments, it can be preferable to anneal the thin film material for an extended period of time (e.g., more than or about 10 minutes, more than or about 20 minutes, or more than or about 30 minutes), for example, if a larger dielectric constant is desirable. In various embodiments, dielectric materials according to the present teachings can have a dielectric constant of at least about 2.3, preferably between about 2.5 and about 10, more preferably between about 3 and about 5.

In some embodiments, the linear polymer of formula (II) can be partially hydrogenated, then thermally crosslinked. Particularly, the linear polymer of formula (II) can be partially hydrogenated using either homogenous or heterogeneous transition metal catalysts such as Pd and Ru complexes. The partial hydrogenation reaction can be performed under atmospheric pressure and at room temperature (e.g., standard ambient temperature and pressure, at about 25° C. and about 1 atm), or at elevated temperatures and/or with pressurized hydrogen. The extent of hydrogenation can be monitored using various methods known in the art. For example, the degree of hydrogenation can be determined from infrared spectra obtained with samples taken during various points of the hydrogenation reaction. In various embodiments, the present polymers can be partially hydrogenated such that no more than about 80%, and preferably no more than about 50%, of the unsaturated bonds in the backbone of the linear polymer are hydrogenated. Partial hydrogenation of the present linear polymer can lower the leakage current density of the polymer while keeping the linear polymer readily thermally crosslinkable. As described above, the partially hydrogenated linear polymer can be thermally cured at a temperature of lower than or about 350° C., of lower than or about 300° C., at a temperature of lower than or about 200° C., at a temperature of lower than or about 180° C., at a temperature of lower than or about 150° C., at a temperature of lower than or about 140° C., or at a temperature of lower than or about 130° C., for as brief as about 8 minutes or less, and results in a physically robust thin film material with good interfacial properties suitable for further device processing.

In some embodiments, the linear polymer of formula (II) can undergo epoxidation to provide an epoxide polymer which is also thermally crosslinkable. For example, the linear polymer of formula (II) can be reacted with a strong oxidizing agent including various peroxy acids such as meta-chloroperoxybenzoic acid (mCPBA) to provide an epoxide polymer as shown in the scheme below:

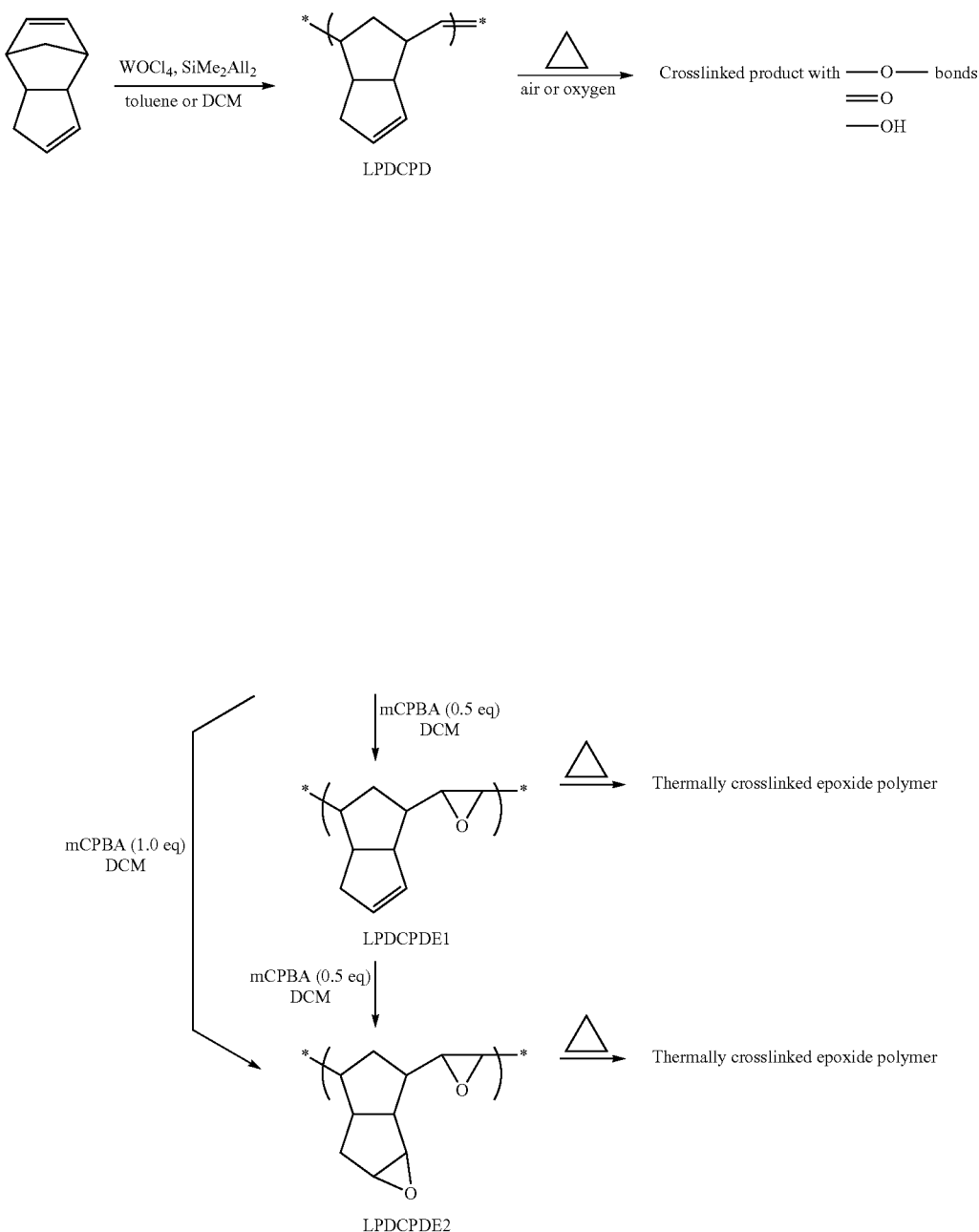

In certain embodiments, crosslinking of the present polymers (including those embodiments that do not comprise photocrosslinkable end functional groups as well as the epoxide polymers described herein) can be performed by radiation. For example, exposure to ultraviolet light at a wavelength of about 250-500 nm (e.g., between about 300 nm and about 450 nm) can be used. In embodiments where the present polymers are end-functionalized (e.g., with an acrylate group), the end functional group can be used for an additional crosslinking step by radiation. For example, exposure to light of wavelength $\lambda_1$ can mostly crosslink the polymer backbone, whereas exposure to light of wavelength $\lambda_2$ can promote crosslinking of the end functional group. Photocrosslinking, in general, also can be achieved by other types of radiation, for example, with ion beams of charged particles, and electron beams from radioactive sources. Further, in certain embodiments, initiators can be used (regardless of whether the present linear polymers are end-functionalized or not). For example, the initiators can be present as an additive in the coating formulation comprising the present polymers. Examples of initiators can include radical initiators such as azobisisobutyronitrile (AIBN), photoacid generators (PAGs) such as triphenylsulfonium triflate, radical photoinitiators such as diphenyl(2,4,6-trimethylbenzoyl)phosphine oxide (TPO), or photosensitizers such as benzophenone and 1-chloro-4-propoxy-9H-thioxanthen-9-one. For example, the epoxide polymers (LPDCPDE1 and LPDCPDE2) described herein can be photocrosslinked when used with various PAGs. Some commercially available PAGs are:

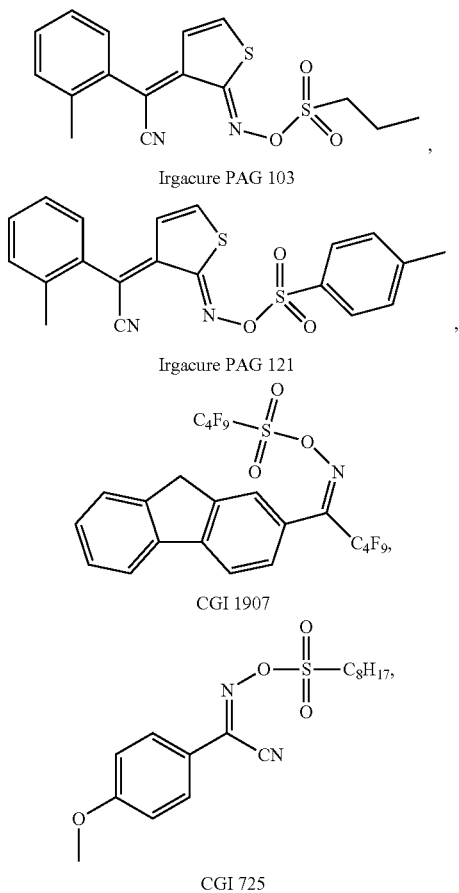

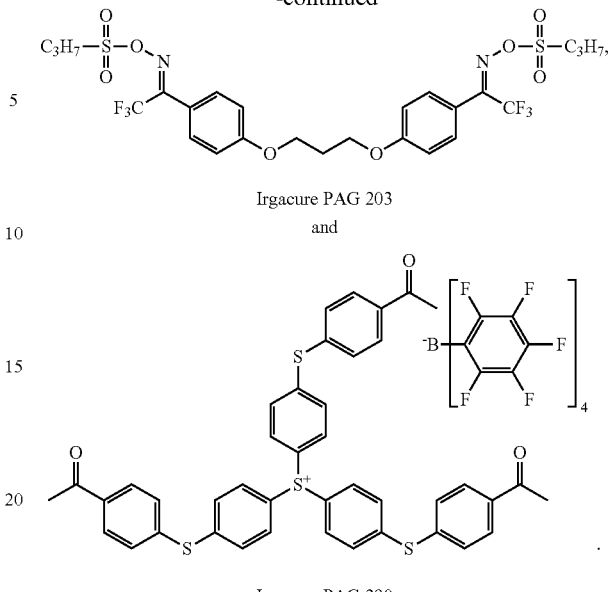

Subsequent to the formation of the crosslinked matrix, the thin film material of the present teachings can be subjected to further patterning and processing steps, by which additional layers, including additional dielectric, semiconductor and/or conducting layers, can be formed thereon.

The present polymers, even without crosslinking as demonstrated by Example 4 hereinbelow, typically have excellent electrically insulating properties and a low leakage current density, which enable their use as dielectrics. Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a thin-film transistor device. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

In various embodiments, the present polymers can have very low leakage current densities as measured from standard MIS and MIM capacitor structures. For example, dielectric materials prepared from a polymer according to the present teachings can have a leakage current density of less than or equal to about $1 \times 10^{-6}$ A/cm$^2$ at E=2 MV/cm, less than or equal to about $1 \times 10^{-7}$ A/cm$^2$ at E=2 MV/cm, less than or equal to about $1 \times 10^{-8}$ A/cm$^2$ at E=2 MV/cm, less than or equal to about $8 \times 10^{-9}$ A/cm$^2$ at E=2 MV/cm, less than or equal to about $7 \times 10^{-9}$ A/cm$^2$ at E=2 MV/cm, less than or equal to about $6 \times 10^{-9}$ A/cm$^2$ at E=2 MV/cm, less than or equal to about $4 \times 10^{-9}$ A/cm$^2$ at E=2 MV/cm, less than or equal to about $2 \times 10^{-9}$ A/cm$^2$ at E=2 MV/cm, or less than or equal to about $1 \times 10^{-9}$ A/cm$^2$ at E=2 MV/cm. Dielectric materials prepared from the present polymers also can withstand very high breakdown voltages (i.e., the maximum voltage difference that can be applied across the dielectric before it breaks down and begins to conduct). For example, dielectric materials of the present teachings can withstand a breakdown voltage of 4 MV/cm or higher, a breakdown voltage of 6 MV/cm or higher, or a breakdown voltage of 7 MV/cm or higher.

As described hereinabove, because the present polymers can be soluble in solvents that are orthogonal to those commonly used to dissolve organic or inorganic semiconducting compounds, the present polymers can be used, in whole or in part, as the dielectric layer of a solution-processed organic field-effect transistor. A typical field-effect transistor (FET) includes a number of layers and can be configured in various ways. For example, a FET can include a substrate, a dielectric layer, a semiconductor layer, source and drain electrodes in contact with the semiconductor layer, and a gate electrode adjacent to the dielectric layer. When a potential is applied on the gate electrode, charge carriers are accumulated in the semiconductor layer at an interface with the dielectric layer. As a result, a conductive channel is formed between the source electrode and the drain electrode and a current will flow if a potential is applied to the drain electrode.

FIG. 1 illustrates the four common types of FET structures: (a) bottom-gate top-contact structure, (b) bottom-gate bottom-contact structure, (c) top-gate bottom-contact structure, and (d) top-gate top-contact structure. As shown in FIG. 1, a FET can include a dielectric layer (e.g., shown as 8, 8', 8", and 8'" in FIGS. 1a, 1b, 1c, and 1d, respectively), a semiconductor/channel layer (e.g., shown as 6, 6', 6", and 6'" in FIGS. 1a, 1b, 1c, and 1d, respectively), a gate contact (e.g., shown as 10, 10', 10", and 10'" in FIGS. 1a, 1b, 1c, and 1d, respectively), a substrate (e.g., shown as 12, 12', 12", and 12'" in FIGS. 1a, 1b, 1c, and 1d, respectively), and source and drain contacts (e.g., shown as 2, 2', 2", 2'", 4, 4', 4", and 4'" in FIGS. 1a, 1b, 1c, and 1d, respectively). One or more optional layers also can be present. For example, an optional buffer layer can be deposited on top of the substrate to improve the wetting and crystallization of an overlying layer. An optional surface-modifying film can be disposed on the gate electrode.

Figure 2:
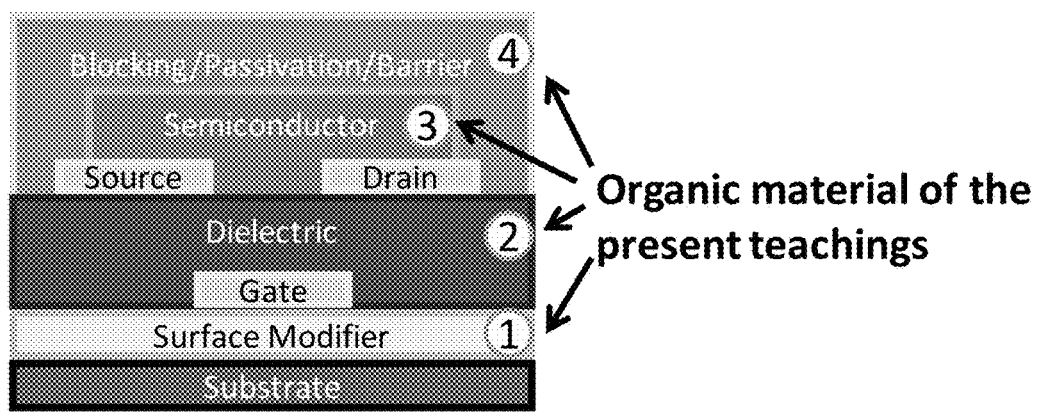
FIG. 2 shows a bottom-gate top-contact thin film transistor, illustrating that the linear polymers of the present teachings can be employed as a surface modifying layer (layer 1), a gate dielectric layer (layer 2), an additive within the semiconductor layer (layer 3), and/or an etch-stop/blocking/passivation/barrier/encapsulation layer (layer 4).

Using an example of a bottom-gate top-contact thin film transistor, FIG. 2 illustrates where the organic material of the present teaching can be employed: in layer 1 (as a surface modifier), layer 2 (as the gate dielectric), layer 3 (as an additive to the semiconductor), and/or encapsulation layer 4 (as an etch-stop/blocking/passivation/barrier material).

Accordingly, the present polymers can be deposited as a thin film material adjacent to a semiconductor layer and function as the dielectric layer in a thin film transistor. Specifically, the thin film material can be coupled to the semiconductor thin film layer on one side and an electrically conductive component (i.e., a gate electrode) on the opposite side. The thickness of the dielectric layer typically ranges from about 10 nm to about 5000 nm, preferably from about 50 nm to about 1000 nm, and more preferably from about 200 nm to about 500 nm. In some embodiments, one or more interlayers can be present between the semiconductor layer and the dielectric layer comprising the present polymers. The interlayer(s) can be prepared from one or more linear dielectric polymers, examples of which are provided hereinbelow.

In some embodiments, the dielectric layer can be a multi-layer laminate having two or more layers of dielectric materials sequentially deposited on top of each other (although one or more interlayers can be present), where at least one of the layers is prepared from a composition including a polymer according to the present teachings. For example, the multi-layer laminate can include at least one layer prepared from a composition including the present polymers alone in a liquid medium, and at least one layer prepared from a linear dielectric polymer or an inorganic (e.g., metal oxide) dielectric material. In embodiments where the dielectric material includes organic and inorganic sublayers, an interlayer can be present to improve adhesion between the sublayers.

Examples of linear dielectric polymers that can be used in combination with the present polymers (either in the same dielectric layer or in a separate dielectric layer) can include, without limitations, fluorinated para-xylene, fluoropolyarylether, fluorinated polyimide, polystyrene, poly(α-methyl styrene), poly(α-vinylnaphthalene), poly(vinyltoluene), polyethylene, cis-polybutadiene, polypropylene, polyisoprene, poly(4-methyl-1-pentene), poly(tetrafluorethylene), poly(chlorotrifluoroethylene), poly(2-methyl-1,3-butadiene), poly(p-xylylene), poly(α-α-α'-α'-tetrafluoro-p-xylylene), poly[1,1-(2-methyl propane) bis (4-phenyl) carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethyl styrene), polypropylene-co-1-butene, poly(methyl methacrylate), poly(ethyl methacrylate), poly(2-hydroxyethyl methacrylate), poly(butyl methacrylate), poly(hexyl methacrylate), poly(benzyl methacrylate), poly(vinyl phenol), poly(vinyl alcohol), poly(vinyl alcohol-co-ethylene), poly(isobutylene/methyl methacrylate), poly(vinyl phenol/methyl methacrylate), poly(vinyl chloride), polysaccharides such as 2-hydroxyethyl cellulose, cellulose actate, cellullose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly(4-vinylpyridine-co-butyl methacrylate), poly(4-vinylpyridine-co-styrene), poly(l-vinylpyrrolidone-co-styrene), poly(l-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-alt-maleic anhydride), poly(allylamine), poly(ethyleneimine), poly(vinyl acetate), poly(vinyl cinnamate), poly(vinyl stearate), poly(vinyl propionate), poly(vinyl formate), poly(ethylene glycol), poly(propylene glycol), poly(styrene-co-acrylonitrile), poly(maleic anhydride-alt-1-octadecane), poly(tetrahydrofuryl methacrylate), poly(Bisphenol A carbonate), poly(propylene carbonate), poly(1,4-butylene terephthalate), poly(diallyl isophthalate), poly(hexafluoropropylene oxide), poly(fluoropropylene oxide-co-perfluoroformaldehyde), and combinations thereof. In addition, perfluoro(1-butenyl vinyl ether) homocyclopolymers (for example, those under the trade name CYTOP®) can be used. Examples of such fluorinated cyclopolymers include those having one of the following structures:

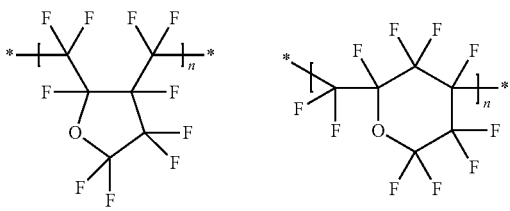

Poly[4,5-difluoro-2,2-bis(trifluoromethyl)-1,3-dioxole-co-tetrafluoroethylene (commercially available under the trade name Teflon® AF 2400) having the following structure also can be used:

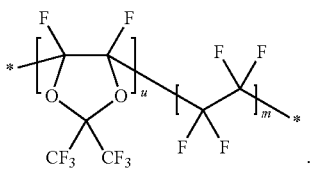

The semiconductor layer can comprise an organic semiconductor material prepared from an organic semiconducting molecule or polymer. Examples include various fused heterocycles, aromatic hydrocarbons, polythiophenes, fused (hetero)aromatics (e.g., perylene imide and naphthalene imide small molecule or polymers), and other such organic semiconductor compounds or materials, whether p-type or n-type, otherwise known or found useful in the art. For example, the semiconductor component can be prepared from one or more compounds and/or polymers as described in U.S. Pat. Nos. 6,585,914, 6,608,323, 6,991,749, 7,374702, 7,528,176, 7,569,693, 7,605,225, 7,671,202, 7,893,265, 7,892,454, 7,902363, 7,928,249, 7,947,837, 8,022,214; and International Publication Nos. WO2009/098254, WO2009/098252, WO2009/098253, WO2009/098250, WO2010/117449, and WO2011/082234, the disclosure of each of which is incorporated by reference herein. In some embodiments, the semiconductor layer can comprise an inorganic semiconductor material such as silicon, germanium, gallium arsenide, various metal oxides and metal chalcogenides known in the art, and the like. Examples of metal oxide semiconductors include indium oxide ($In_2O_3$), indium zinc oxide (IZO), zinc tin oxide (ZTO), indium gallium oxide (IGO), indium-gallium-zinc oxide (IGZO), indium tin zinc oxide (ITZO), tin oxide ($SnO_2$), and zinc oxide (ZnO). Examples of metal chalcogenide semiconductors include cadmium sulfide (CdS), cadmium selenide (CdSe), and the like. Solution-phase processed metal oxides and metal chalcogenides are described in, for example, U.S. Pat. No. 8,017,458, the entire disclosure of which is incorporated by reference herein for all purposes. Alternatively, the semiconductor layer can comprise a vapor-phase processed (e.g., sputtered) metal oxide or chalcogenide.

In some embodiments, the present linear polymers can be a component (e.g., as an additive) in the semiconductor layer. Specifically, both the semiconductor (SC) and the polymer (Pol) can be dissolved in a solvent in which both materials are soluble. Typical total concentrations are from about 2 mg/ml to about 20 mg/ml, preferably between about 5 mg/ml and about 15 mg/ml. The weight ratio between the semiconductor and the polymer (SC:Pol, w:w) typically can range from about 10:1 to about 1:10, preferably from about 8:2 to about 2:8, more preferably from about 6:4 to about 4:6. The formulation can be spin-coated and the corresponding semiconducting layer film can be annealed at temperatures at which the polymers of the present teachings do not crosslink. Alternatively, the Pol portion of the semiconductor layer film can be crosslinked by heating alone, by radiation alone, by heating followed by radiation, or by radiation followed by heating. For example, the semiconductor layer can be prepared from a composition comprising one of the organic semiconducting molecules or polymers listed hereinabove and at least one of the present linear polymers, thereby providing a blend organic semiconductor material. In particular embodiments, the semiconductor layer can be prepared from a composition comprising a small-molecule organic semiconducting compound (such as, but not limited to, any of the small-molecule OSCs listed hereinabove) and a linear polymer according to the present teachings as an additive.

A dielectric material according to the present teachings can be prepared by dissolving one or more polymers described herein in an organic solvent to provide a dielectric composition, depositing (e.g., by spin-coating or printing) the dielectric composition onto a substrate, and optionally performing at least one curing step to form a dielectric material. For example, the curing step can involve heating at a temperature within the range of about 100° C. and about 350° C. (preferably between about 120° C. and about 250° C.) for a duration between about 2 minutes and about 60 minutes (preferably between about 5 minutes and about 30 minutes). The curing step also can involve irradiation (e.g., with ultraviolet light). In certain embodiments, one or more metal oxides can be added to the dielectric composition prior to the depositing step. In certain materials, one or more linear dielectric polymers can be added to the dielectric composition prior to the depositing step. In certain embodiments, one or more crosslinkers can be added to the dielectric composition prior to the depositing step. In certain materials, one or more photoacid generators can be added to the dielectric composition prior to the depositing step. An organic semiconductor layer can be formed via a solution-phase process prior or after the formation of the dielectric layer. For example, the organic semiconductor layer can be formed from a composition comprising an organic semiconducting molecule or polymer in an organic solvent that is orthogonal to the organic solvent in the dielectric composition. An inorganic semiconductor can be formed by vapor deposition such as sputtering.

In some embodiments, a multi-layer dielectric material according to the present teachings can be prepared by dissolving one or more polymers described herein in an organic solvent to provide a dielectric composition, where the dielectric composition optionally can include at least one of a linear dielectric polymer, a metal oxide, and a crosslinker; depositing (e.g., by spin-coating or printing) the dielectric composition onto a substrate to form a first layer; and depositing a composition that includes a linear dielectric polymer or a metal oxide to form a second layer. After each depositing step, a curing step can be performed, e.g., by heating and optionally irradiation using parameters described herein. An organic semiconductor layer can be formed via a solution-phase process prior or after the formation of the multi-layer dielectric layer. For example, the organic semiconductor layer can be formed from a composition comprising an organic semiconducting molecule or polymer in an organic solvent that is orthogonal to the organic solvent in the dielectric composition. An inorganic semiconductor can be formed by vapor deposition such as sputtering.

Crosslinked thin film materials prepared from the present polymers also can be used as a passivation layer in a thin film transistor given their barrier properties to moisture and oxygen. When used as a passivation layer, the thin film material can have a thickness in the range of about 0.2 µm to about 5 µm. The passivation layer can be prepared by dissolving one or more polymers described herein in an organic solvent to provide a coating formulation, depositing (e.g., by spin-coating or printing) the coating formulation onto a substrate (e.g., overlying the source and drain electrodes), and optionally performing at least one curing step to form a passivation layer. The curing step can be induced by heat or radiation. For example, the curing step can involve heating at a temperature within the range of about 100° C. and about 350° C. (preferably between about 120° C. and about 250° C.) for a time period between about 2 minutes and about 60 minutes (preferably between about 5 minutes and about 30 minutes). The curing step also can involve irradiation (e.g., with ultraviolet light). By using the present crosslinked organic materials, which can provide improved moisture- and oxygen-blocking properties, as the passivation layer, the thin film transistor can achieve better device reliability. In addition, because the present linear polymers can be soluble in solvents that are orthogonal to those typically used to deposit organic semiconducting molecules or polymers, a passivation layer comprising the present linear polymers can be formed via a solution-phase process on top of the source and drain electrodes in a top-contact transistor structure without damaging the organic semiconductor channel region.

Because the present polymers can be crosslinked at relatively low temperatures (e.g., below about 160° C.) or by radiation, they are compatible with a large variety of substrates, including plastic, flexible substrates that have a low temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be an inexpensive rigid substrate that has relatively low heat and/or chemical resistance. For example, the present organic thin films can be coupled to an inexpensive soda lime glass substrate, as opposed to more expensive and higher heat and/or chemical resistant glass substrates such as quartz and VYCOR®. In embodiments where a very high degree of crosslinking is desirable, higher crosslinking temperatures (e.g., about 350° C.) may be used, in which case, more thermally-resistant plastic substrates or flexible glasses or metals can be used. Substrate-gate materials commonly used in thin-film transistors include doped silicon wafer, tin-doped indium oxide on glass, tin-doped indium oxide on polyimide or mylar film, aluminum or other metals alone or coated on a polymer such as polyethylene terephthalate, a doped polythiophene, and the like.

Accordingly, the present teachings also relate to electronic, optical, or optoelectronic device comprising an organic layer comprising a crosslinked matrix of a linear polymer of formula (A), where the organic layer can be in contact or coupled to a semiconductor layer (e.g., an organic or inorganic semiconductor layer) and/or a conductive component (e.g. a metallic contact that functions as either the source, drain, or gate electrode) either directly or via optionally present intervening layer(s) such as a protective or surface modifying interlayer. In various embodiments, the device can be a transistor device, for example an organic thin film transistor (OTFT) (more specifically, an organic field effect transistor (OFET) or an organic light-emitting transistor (OLET)) or a semiconductor oxide thin film transistor (SOTFT). The source and drain electrodes as well as the gate electrode can be made using various deposition techniques. For example, the source and drain electrodes can be deposited through a mask, or can be deposited then etched. Suitable deposition techniques include electrodeposition, vaporization, sputtering, electroplating, coating, laser ablation and offset printing, from metal or metal alloy including copper, aluminum, gold, silver, platinum, palladium, and/or nickel, or an electrically conductive polymer such as polyethylenethioxythiophene (PEDOT).

An aspect of the present teachings relates to a thin film transistor device including a dielectric layer comprising a dielectric material as described herein, a semiconductor layer, a gate electrode, a source electrode, and a drain electrode. The dielectric layer typically is disposed between the semiconductor layer and the gate electrode. Depending on the device geometry, the source and drain electrodes can be disposed above the semiconductor layer (top-contact), or the semiconductor layer can be disposed above the source and drain electrodes (bottom-contact).

Another aspect of the present teachings relates to methods for fabricating field effect transistors that include a dielectric material of the present teachings. The dielectric materials of the present teachings can be used to fabricate various types of field effect transistors including, but not limited to, top-gate top-contact structures, top-gate bottom-contact structures, bottom-gate top-contact structures, and bottom-gate bottom-contact structures.

In some embodiments, the method can include depositing a dielectric composition according to the present teachings onto a substrate (gate) to form a dielectric layer, wherein the dielectric composition includes one or more linear polymers described herein dissolved in a first solvent; depositing a semiconducting composition onto the dielectric layer to form a semiconductor layer, where the semiconducting composition includes one or more semiconducting compounds (e.g., small molecule compounds or polymers) dissolved in a second solvent, and where the first solvent and the second solvent are orthogonal solvents; and forming a first electrical contact and a second electrical contact (source and drain) on the semiconductor layer, thereby providing a top-contact bottom-gate organic field effect transistor. The method can include curing the dielectric layer, for example, by heating, by radiation, or by both heating and radiation (in either order) to induce crosslinking.

In some embodiments, the method can include depositing a dielectric composition according to the present teachings onto a substrate (gate) to form a dielectric layer, wherein the dielectric composition includes one or more linear polymers described herein dissolved in a first solvent; forming a first electrical contact and a second electrical contact (source and drain) above the dielectric material; and depositing a semiconducting composition above the first and second electrical contacts and the dielectric layer (i.e., to cover the electrical contacts and an area of the dielectric material between the electrical contacts) to form a semiconductor layer, where the semiconducting composition includes one or more semiconducting compounds (e.g., small molecule compounds or polymers) dissolved in a second solvent, and where the first solvent and the second solvent are orthogonal solvents; to provide a bottom-contact bottom-gate organic field effect transistor. The method can include curing the dielectric layer, for example, by heating, by radiation, or by both heating and radiation (in either order) to induce crosslinking.

In some embodiments, the method can include forming a first electrical contact and a second electrical contact (source and drain) on a substrate; depositing a semiconducting composition above the first and second electrical contacts (i.e., to cover the electrical contacts and an area of the substrate between the electrical contacts) to form a semiconductor layer, where the semiconducting composition includes one or more semiconducting compounds (e.g., small molecule compounds or polymers) dissolved in a first solvent; depositing a dielectric composition according to the present teachings above the semiconductor layer to form a dielectric layer, where the dielectric composition includes one or more linear polymers described herein dissolved in a second solvent, and where the first solvent and the second solvent are orthogonal solvents; and forming a third electrical contact (gate) above the dielectric material, wherein the third electrical contact is above an area between the first and second electrical contacts, to provide a bottom-contact top-gate organic field effect transistor. The method can include curing the dielectric layer, for example, by heating, by radiation, or by both heating and radiation (in either order) to induce crosslinking.

In some embodiments, the method can include depositing a semiconducting composition on a substrate to form a semiconductor layer, where the semiconducting composition includes one or more semiconducting compounds (e.g., small molecule compounds or polymers) dissolved in a first solvent; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more linear polymers described herein dissolved in a second solvent, and where the first solvent and the second solvent are orthogonal solvents; and forming a third electrical contact (gate) above the dielectric material, wherein the third electrical contact is above an area between the first and second electrical contacts, to provide a top-contact top-gate organic field effect transistor. The method can include curing the dielectric layer, for example, by heating, by radiation, or by both heating and radiation (in either order) to induce crosslinking.

In some embodiments, the method can include depositing a dielectric composition according to the present teachings onto a substrate (gate) to form a dielectric layer, wherein the dielectric composition includes one or more linear polymers described herein; forming a metal oxide semiconductor layer on the dielectric layer; and forming a first electrical contact and a second electrical contact (source and drain) on the semiconductor layer, thereby providing a top-contact bottom-gate metal oxide field effect transistor. The method can include curing the dielectric layer, for example, by heating, by radiation, or by both heating and radiation (in either order) to induce crosslinking.

In some embodiments, the method can include depositing a dielectric composition according to the present teachings onto a substrate (gate) to form a dielectric layer, wherein the dielectric composition includes one or more linear polymers described herein; forming a first electrical contact and a second electrical contact (source and drain) above the dielectric material; and forming a metal oxide semiconductor layer above the first and second electrical contacts and the dielectric layer (i.e., to cover the electrical contacts and an area of the dielectric material between the electrical contacts), to provide a bottom-contact bottom-gate metal oxide field effect transistor. The method can include curing the dielectric layer, for example, by heating, by radiation, or by both heating and radiation (in either order) to induce crosslinking.

In some embodiments, the method can include forming a first electrical contact and a second electrical contact (source and drain) on a substrate; forming a metal oxide semiconductor layer above the first and second electrical contacts (i.e., to cover the electrical contacts and an area of the substrate between the electrical contacts); depositing a dielectric composition according to the present teachings above the semiconductor layer to form a dielectric layer, where the dielectric composition includes one or more linear polymers described herein; and forming a third electrical contact (gate) above the dielectric material, wherein the third electrical contact is above an area between the first and second electrical contacts, to provide a bottom-contact top-gate metal oxide field effect transistor. The method can include curing the dielectric layer, for example, by heating, by radiation, or by both heating and radiation (in either order) to induce crosslinking.

In some embodiments, the method can include forming a metal oxide semiconductor layer on a substrate; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more linear polymers described herein; and forming a third electrical contact (gate) above the dielectric material, wherein the third electrical contact is above an area between the first and second electrical contacts, to provide a top-contact top-gate metal oxide field effect transistor. The method can include curing the dielectric layer, for example, by heating, by radiation, or by both heating and radiation (in either order) to induce crosslinking.

The semiconductor layer and the various electrical contacts can be formed by various deposition processes known to those skilled in the art. For example, the semiconductor layer can be formed by processes such as, but not limited to, sputtering, ion-assisted deposition (IAD), physical vapor deposition, different types of printing techniques (e.g., flexo printing, litho printing, gravure printing, ink-jetting, pad printing, and so forth), drop casting, dip coating, doctor blading, roll coating, and spin-coating. In preferred embodiments, the semiconductor layer is formed from a solution-phase process such as spin-coating, slot coating, or printing. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

Yet another aspect of the present teachings relates to methods for fabricating field effect transistors that include a surface-modifying layer of the present teachings. For example, the method can include depositing a surface modifier composition onto a substrate (e.g., glass), wherein the surface modifier composition includes one or more linear polymers described herein, prior to formation of the source and drain contacts, formation of the semiconductor layer, formation of the gate dielectric layer, and formation of the gate contact (regardless of sequence of these steps as required by the desired configuration). The method can include curing the surface-modifying layer, for example, by heating, by radiation, or by both heating and radiation (in either order) to induce crosslinking.

A further aspect of the present teachings relates to methods for fabricating field effect transistors that include an encapsulation layer of the present teachings. For example, subsequent to the formation of the TFT stack, the method can include depositing a composition including one or more linear polymers of the present teachings over the entire TFT stack to form an encapsulation layer, and optionally curing the encapsulation layer by heating, by radiation, or by both heating and radiation (in either order) to induce crosslinking.

The following examples are provided to illustrate further and to facilitate the understanding of the present teachings and are not in any way intended to limit the invention.

Example 1: Synthesis of Linear Poly(dicyclopentadiene) (LPDCPD)

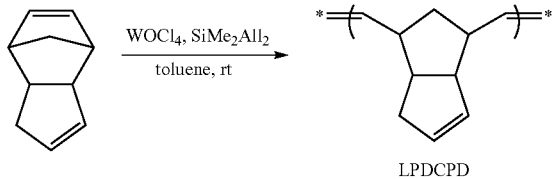

LPDCPD

To a 250-ml round bottom flask under nitrogen were added dicyclopentadiene (4.42 g, 33.43 mmol) and anhydrous toluene (100 ml). Then, diallyldimethylsilane (0.12 ml, 95.4 mg, 0.68 mmol) and $WOCl_4$ (116.16 mg, 0.34 mmol) were added in sequence as catalysts for the polymerization reaction of dicyclopentadiene. The mixture was stirred under nitrogen at room temperature for 4 hours until the catalysts were deactivated by the addition of 2% NaOH in MeOH (300 ml). The suspension was centrifuged to isolate the white solid that was partitioned between $H_2O$ (100 ml) and cyclohexane (150 ml). The organic phase was separated, dried over $MgSO_4$, filtered, concentrated and placed under vacuum at room temperature overnight. Finally, a white powder was obtained (1.25 g, yield 28%). $^1$H NMR (CDCl3, 500 MHz): δ=5.70 (br m, 1H), 5.62-5.24 (br m, 3H), 3.33-3.16 (br m, 1H), 3.00-2.52 (br m, 3H), 2.44-2.20 (br m, 2H), 1.72-1.56 (br m, 1H), 1.34-1.14 (br m, 1H). EA: calc. C, 90.85; H, 9.15; found C, 89.82; H, 9.16.

Example 2: Thermal Crosslinking of LPDCPD

A 70-nm thin film of LPDCPD spin-coated on a silicon dioxide substrate from a polymer solution was baked in a nitrogen-filled glove box at up to 300° C. for 0.5 h. After cooling down, the film was transferred out and could be completely dissolved by dichloromethane. NMR showed no difference between before and after thermal treatment in the nitrogen glove box, suggesting a lack of crosslinking.

Another 70-nm thin film of LPDCPD spin-coated on a silicon dioxide substrate from a polymer solution was baked in air at 150° C. for 0.5 h. The film was found to be resistant to dichloromethane. IR spectra of the peeled-off film showed additional chemical groups such as C=O, C—O and O—H.

A formulation of LPDCPD in cyclohexane (10 mg/ml) was spin-coated on silicon substrates for 30s at different rates. The films obtained were annealed on a heating plate in air at different temperatures for different annealing times. After cooling down, the films were immersed in cyclohexane for 5 minutes to test their resistance to the mother solvent. The results are reported in Table 1 below.

TABLE 1

| Rpm | Baking temp. | Baking time | Chemical Resistance |
|---|---|---|---|
| 2000 | 350° C. | 2 min | Excellent |
| 2000 | 300° C. | 2 min | Excellent |
| 2000 | 200° C. | 2 min | Excellent |
| 2000 | 180° C. | 5 min | Excellent |
| 2000 | 150° C. | 5 min | Excellent |
| 2000 | 100° C. | 7 min | Poor |
| 2000 | 120° C. | 5 min | Poor |
| 2000 | 130° C. | 2 min | Fair |
| 2000 | 130° C. | 5 min | Excellent |
| 2000 | 140° C. | 1 min | Fair |
| 2000 | 140° C. | 5 min | Excellent |
| 2000 | 140° C. | 2 min | Excellent |
| 700 | 140° C. | 5 min | Excellent |

The above results showed that thin films of LPDCPD can be thermally-crosslinked at as low as about 130° C. for only several minutes and achieve solvent resistance to cyclohexane.

Example 3: UV Crosslinking of LPDCPD

Thin films of LPDCPD with different types of photo initiators and/or sensitizers can be UV cured at different wavelengths. For example, a solution of LPDCPD (80 mg), bis(2,4,6-trimethylbenzoyl)-phenylphosphine oxide (4 mg) and 2-isopropylthioxanthone (4 mg) in 1 ml cyclooctane was spin-coated onto silicon substrates at 4000 r.p.m. for 30 seconds. The resulting films were then exposed to UV light passing through a UV filter at 370 nm for different dosages at a light density of about 15 mW/cm$^2$. After exposure, the films were dipped into cyclooctane for 20 seconds, followed by inspection of the film condition by eyes. The results are reported in Table 2 below.

TABLE 2

| UV curing dosage (mJ/cm$^2$) | Chemical Resistance |
|---|---|
| 150 | Poor |
| 300 | Fair |
| 450 | Good |
| 600 | Good |
| 750 | Very Good |
| 900 | Excellent |

Example 4: Dielectric Characterization of Thermally Crosslinked LPDCPD

Metal-insulator-semiconductor (MIS) capacitor structures were fabricated using dielectric films prepared from thermally crosslinked LPDCPD, and the capacitance of the dielectric films was measured. For MIS structure fabrication, heavily doped n-type Si (MEMC Electronic Materials, Antimony/n-doped) was used as the metal onto which a dielectric film was spin-coated to form the insulating layer. Top Au electrodes were then vacuum-deposited on top of the dielectric film at <1×10$^{-6}$ Torr to complete the MIS capacitor structure.

Heavily doped silicon substrates were first cleaned in consecutive ultrasonic baths of acetone, soap water, acetone and IPA for 10 minutes each. A solution of LPDCPD (80 mg/ml in toluene) was spin-coated onto the substrates at different speeds and annealed at different temperatures for different periods of time. To complete the devices, a square-shaped Au top electrode (500 nm thick) was thermally evaporated. The fabricated devices have an area of about 1 mm². The dielectric constant of LPDCPD films processed under different conditions was computed from the measured capacitance values. The results are reported in Table 3 below.

TABLE 3

| Spin speed | Thickness | $T_{anneal}$ | Baking time | Capacitance | Dielectric constant |
|---|---|---|---|---|---|
| 500 rpm | 800 nm | 150° C. | 10 min | 43 pF | 3.89 |
| 1000 rpm | 560 nm | 150° C. | 10 min | 62 pF | 3.92 |
| 1500 rpm | 510 nm | 150° C. | 10 min | 68 pF | 3.92 |
| 3000 rpm | 350 nm | 150° C. | 10 min | 99 pF | 3.91 |
| 5000 rpm | 320 nm | 150° C. | 10 min | 107 pF | 3.87 |
| 1000 rpm | 570 nm | 150° C. | 0 min | 40 pF | 2.58 |
| 1000 rpm | 575 nm | 150° C. | 5 min | 55 pF | 3.57 |
| 1000 rpm | 570 nm | 150° C. | 30 min | 61 pF | 3.93 |
| 1000 rpm | 575 nm | 150° C. | 60 min | 61 pF | 3.96 |
| 1000 rpm | 575 nm | 200° C. | 10 min | 60 pF | 3.90 |
| 1000 rpm | 565 nm | 250° C. | 10 min | 61 pF | 3.89 |
| 1000 rpm | 565 nm | 300° C. | 10 min | 62 pF | 3.96 |
| 1000 rpm | 570 nm | 350° C. | 10 min | 61 pF | 3.93 |

Figure 3:
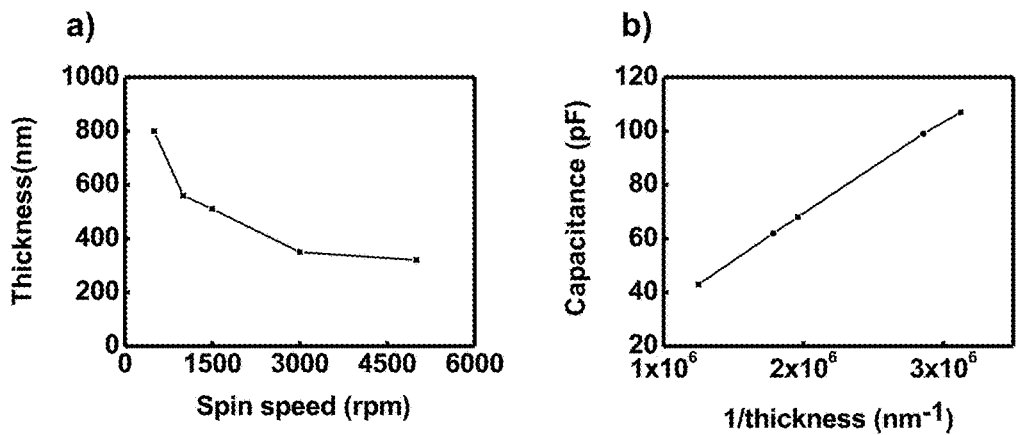
FIG. 3 shows the correlations between film thickness and (a) spin-coating speed and (b) capacitance of LPDCPD films. Film samples were annealed at about 150° C. for 10 minutes.

A direct correlation between capacitance and 1/thickness was observed as expected (FIG. 3). This experiment also showed that even for an annealing temperature of about 350° C., there was no significant shrinkage or damage to the film. The data indicates that the capacitance of the present thermally curable material is independent of its annealing temperature.

Figure 4:
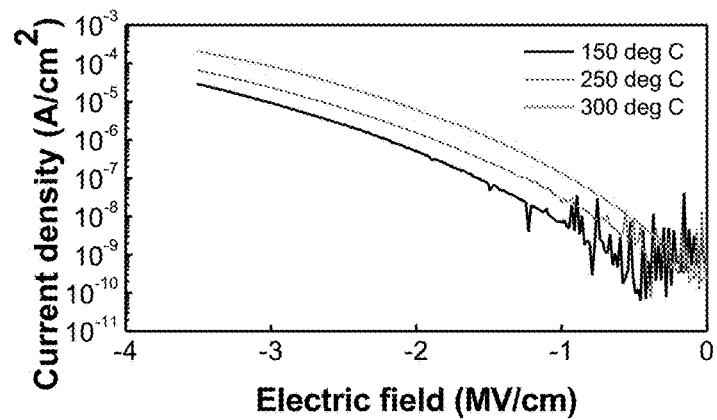
FIG. 4 shows the leakage properties of thermally cross-linked LPDCPD films annealed at 150° C., 250° C., and 300° C., respectively.

Additional devices were fabricated with a smaller electrode (200 μm diameter). Leakage measurements are given in FIG. 4 for the annealing temperatures as indicated.

Example 5: Dielectric Characterization of UV-Crosslinked LPDCPD

Metal-insulator-semiconductor (MIS) capacitor structures were fabricated using dielectric films prepared from UV crosslinked LPDCPD, and the capacitance of the dielectric films was measured. For MIS structure fabrication, heavily doped n-type Si (MEMC Electronic Materials, antimony/n-doped) was used as the metal onto which a dielectric film was spin-coated to form the insulating layer. Top Au electrodes were then vacuum-deposited on top of the dielectric film at <1×10⁻⁶ Torr to complete the MIS capacitor structure.

Figure 5:
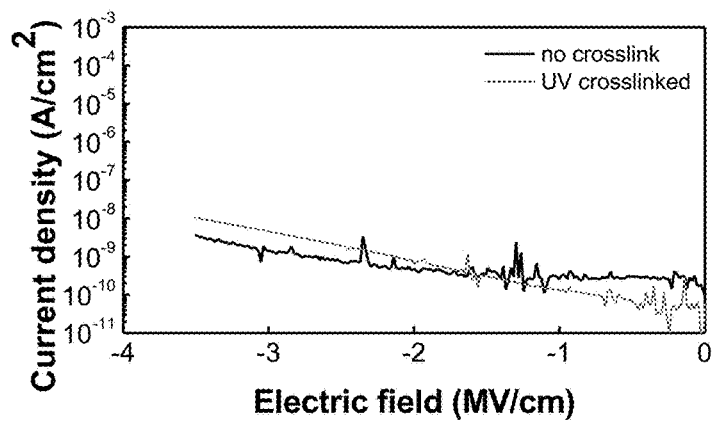
FIG. 5 compares the leakage properties of UV-cured LPDCPD films against uncured LPDCPD films.

Heavily doped silicon substrates were first cleaned in consecutive ultrasonic baths of acetone, soap water, acetone and IPA for 10 minutes each. A solution of LPDCPD (4 mg/ml in toluene with 1-chloro-4-propoxy-9H-thioxanthen-9-one) was spin-coated onto the substrates at 1000 r.p.m. The film samples were then exposed to UV light passing through a UV filter at 370 nm using different dosages at a light density of about 15 mW/cm². To complete the devices, a square-shaped Au top electrode (500 nm thick) was thermally evaporated. The fabricated devices have an area of about 1 mm². The results are reported in Table 4 below. FIG. 5 compares the leakage properties of LPDCPD capacitors with and without UV crosslinking.

TABLE 4

| UV cure dosage (mJ/cm²) | Thickness (nm) | Capacitance (pF) | Dielectric constant |
|---|---|---|---|
| 0 | 730 | 33 | 2.72 |
| 1800 | 730 | 37 | 3.01 |

Example 6: Comparative Dielectric Characterization of Various Crosslinked LPDCPD Capacitors Metal-insulator-semiconductor (MIS) capacitor structures were fabricated using the following materials as the dielectric: uncrosslinked LPDCPD films, UV-crosslinked LPDCPD films, thermally crosslinked LPDCPD films, LPDCPD films that were first UV-crosslinked then thermally crosslinked, and LPDCPD films that were first thermally crosslinked then UV-crosslinked. For MIS structure fabrication, heavily doped n-type Si (MEMC Electronic Materials, antimony/n-doped) was used as the metal onto which a dielectric film was spin-coated to form the insulating layer. Top Au electrodes were then vacuum-deposited on top of the dielectric film at <1×10⁻⁶ Torr to complete the MIS capacitor structure.

Figure 6:
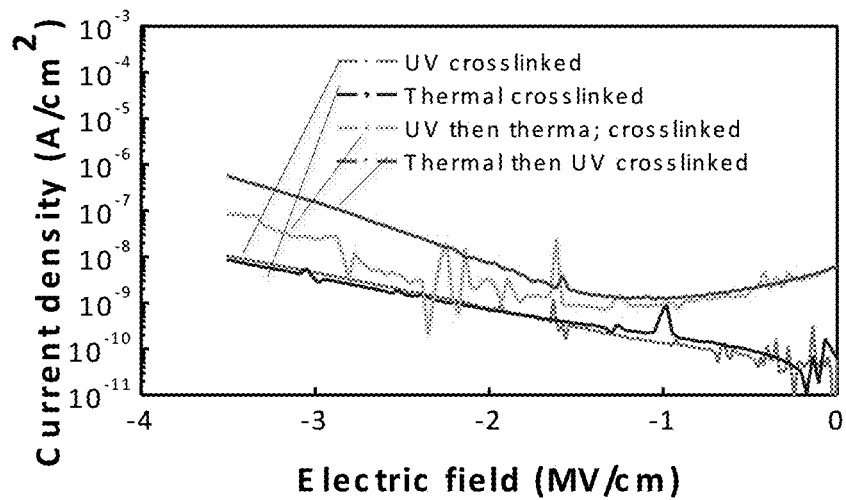
FIG. 6 compares the leakage properties of LPDCPD films with different crosslinking conditions.

Heavily doped silicon substrates were first cleaned in consecutive ultrasonic baths of acetone, soap water, acetone and IPA for 10 minutes each. A solution of LPDCPD (80 mg) and 1-chloro-4-propoxy-9H-thioxanthen-9-one (4 mg) in 1 ml of toluene was spin-coated onto the substrates at 1000 r.p.m. for 30 seconds. The film samples were then crosslinked using the different conditions described above. For UV crosslinking, films were exposed to UV light passing through a UV filter at about 370 nm for a dose of about 1800 mJ/cm². In case of thermal crosslinking, the films were baked on a hot plate at about 150° C. for about 10 minutes. To complete the devices, a square-shaped Au top electrode (500 nm thick) was thermally evaporated. The fabricated devices have an area of about 1 mm². FIG. 6 compares the leakage properties of the various LPDCPD capacitors.

Example 7: OTFT Devices Including an LPDCPD Surface-Modifying Layer

Top-gate bottom-contact OTFTs were fabricated on glass. Substrates were cleaned with acetone and 2-propanol in an ultrasonic bath for 15 minutes each. The linear polymer LPDCPD was dissolved in cyclohexane to give a 10 mg/ml solution, which was spin-coated onto the glass substrates at 700 r.p.m. After deposition, the LPDCPD layer was crosslinked by annealing at 150° C. for 10 minutes. A 50 nm gold layer was thermally evaporated through a shadow mask to form source and drain electrodes. The fabricated devices have a channel length and width of 50 μm and 500 μm, respectively. Prior to OSC deposition, 2-methylbenzenethiol (10% vol in anisole) was grafted on the source and drain electrodes for 5 minutes to modify the silver work function. A dicyanated perylene tetracarboxylic diimide (PDICN₂) semiconductor was deposited by spin-coating to provide an 80 nm-thick layer. The OSC layer was annealed for 5 minutes at 120° C. to remove solvent residues. A bilayer dielectric was deposited by consecutively spin-coating two different dielectric polymer formulations. The device was completed by thermal evaporation of a 50 nm-thick Au gate electrode.

Figure 7:
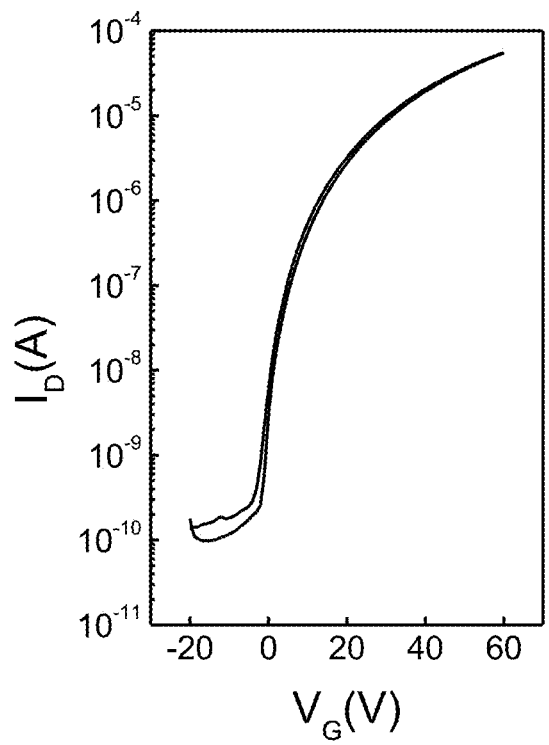
FIG. 7 shows representative transfer plots of a top-gate bottom-contact dicyano-substituted perylene tetracarboxylic diimide ($PDICN_2$)-based organic field effect transistor incorporating a surface-modifying layer according to the present teachings, where the layer modifies the surface of the substrate prior to OSC deposition. The surface-modifying layer was thermally crosslinked at about 150° C. for about 10 minutes.

Typical transfer characteristics of a representative device are shown in FIG. 7. The mobility was determined to be about 1.4 cm²/Vs.

Example 8: OTFT Devices Including an LPDCPD Dielectric Interfacial Layer

Top-gate bottom-contact OTFTs were fabricated on polyethylene naphthalate (PEN) substrates. Substrates were cleaned with acetone and 2-propanol in an ultrasonic bath for 15 minutes each. A polymeric buffer layer (50 nm) was spin-coated onto the substrates to improve OSC wetting and crystallization. After deposition, the film was crosslinked by UV irradiation (370 nm, 4000 mJ). A 50 nm thermally evaporated Ag layer was patterned by classical photolithography and wet-etching processes to create source and drain electrodes (a mixture of nitric, phosphoric, and acetic acids was used as the silver etchant). The fabricated devices have a channel length and width of 10 μm and 1000 μm, respectively. Prior to OSC deposition, 2-methylbenzenethiol (10% vol in anisole) was grafted on the electrodes for 5 minutes to modify the silver work function. A PDICN$_2$-based semiconductor layer (80 nm) was deposited by spin-coating. The OSC layer was annealed for 5 minutes at 120° C. to remove solvent residues. A solution of LPDCPD in cyclohexane (10 mg/ml) was spin-coated at 1500 r.p.m. (50 nm thick) onto the OSC to serve as a first dielectric layer. LPDCPD films were used without any curing or with a 2-minute curing step at 140° C. After annealing, the films were found resistant to cyclohexane demonstrating crosslinking of the polymer. A spin-coated layer of 500 nm PMMA was used as a second dielectric layer. Devices were completed by thermally evaporating a 50-nm thick silver gate electrode.

Figure 8:
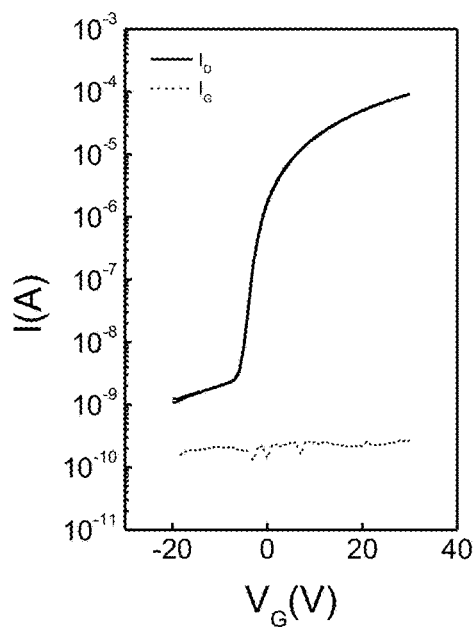
FIG. 8 provides representative transfer plots of top-gate bottom-contact $PDICN_2$-based OFETs incorporating a dielectric layer according to the present teachings, where the dielectric layer is an interfacial layer between the organic semiconductor (OSC) layer and a top dielectric layer: (a) LPDCPD film cured for 2 minutes at 140° C. and (b) uncured LPDCPD film.
Figure 8:
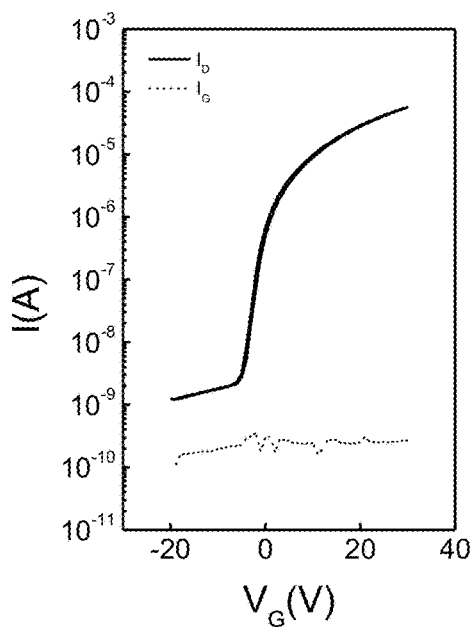

Devices were measured in ambient atmosphere using a Keithley 4200 parameter analyzer. Typical transfer characteristics for devices including crosslinked and uncrosslinked LPDCPDE films are given in FIG. 8. Crosslinked LPDCPD films exhibited higher performance than uncrosslinked films. In both cases, the gate leakage current is negligible. Electrical parameters extracted for $I_D$-$V_G$ characteristics are given in Table 5.

TABLE 5

| Condition | Mobility (cm²/Vs) | VON (V) | $I_{ON}/I_{OFF}$ |
| --- | --- | --- | --- |
| 2 min crosslinking | 0.51 | −6 | 8.5 × 104 |
| No crosslinking | 0.29 | −5 | 4.8 × 104 |

Example 9: OTFT Devices Including an LPDCPD Dielectric Layer and a Small Au Channel Via Lithography Process Top-gate bottom-contact OTFTs were fabricated on polyethylene naphthalate (PEN) substrates. Substrates were cleaned with acetone and 2-propanol in an ultrasonic bath for 15 minutes each. A polymeric buffer layer (50 nm) was spin-coated onto the substrates to improve OSC wetting and crystallization. After deposition, the film was crosslinked by UV irradiation (370 nm, 4000 mJ). A 50 nm thermally evaporated Au layer was patterned by classical photolithography and wet-etching processes to create source and drain electrodes. The fabricated devices have a channel length and width of 10 μm and 1000 μm, respectively. Prior to OSC deposition, 2-methylbenzenethiol (10% vol in anisole) was grafted on the electrodes for 5 minutes to modify the gold work function. A PDICN$_2$-based semiconductor layer (80 nm) was deposited by spin-coating. The OSC layer was annealed for 5 minutes at 120° C. to remove solvent residues. A solution of LPDCPD in cyclohexane (80 mg/ml) was spin-coated at 1000 r.p.m. (50 nm thick) onto the OSC to serve as the dielectric layer. LPDCPD films were annealed for 10 minutes at 150° C. After annealing, the films were found resistant to cyclohexane demonstrating crosslinking of the polymer. Devices were completed by thermally evaporating a 50-nm thick Au gate electrode.

Figure 9:
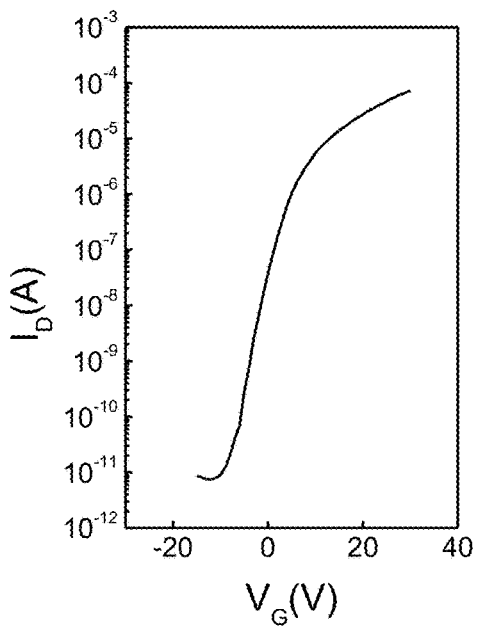
FIG. 9 shows a representative transfer plot of a top-gate bottom-contact $PDICN_2$-based OFET incorporating a dielectric layer according to the present teachings, where the LPDCPD dielectric layer was cured for 10 minutes at 150° C. The device has a patterned Au channel (10 μm x 1000 μm).

Typical transfer characteristics for the above-described devices are given in FIG. 9, with typical mobilities ~0.4 cm²/Vs.

Example 10: OTFT Devices Including an LPDCPD Dielectric Layer and a Long Au Channel Via Thermal Evaporation Top-gate bottom-contact OTFTs were fabricated on glass. Substrates were cleaned with acetone and 2-propanol in an ultrasonic bath for 15 minutes each. A polymeric buffer layer (50 nm) was spin-coated onto the substrates to improve OSC wetting and crystallization. After deposition, the film was crosslinked by UV irradiation (370 nm, 4000 mJ). A 50 nm Au layer was thermally evaporated through a shadow mask to form source and drain electrodes. The fabricated devices have a channel length and width of 50 μm and 500 μm, respectively. Prior to OSC deposition, 2-methylbenzenethiol (10% vol in anisole) was grafted on the electrodes for 5 minutes to modify the gold work function. A PDICN$_2$-based semiconductor layer (80 nm) was deposited by spin-coating. The OSC layer was annealed for 5 minutes at 120° C. to remove solvent residues. A solution of LPDCPD in cyclohexane (80 mg/ml) was spin-coated at 1000 r.p.m. (50 nm thick) onto the OSC to serve as the dielectric layer. LPDCPD films were annealed for 10 minutes at 150° C. Devices were completed by thermally evaporating a 50-nm thick Au gate electrode.

Figure 10:
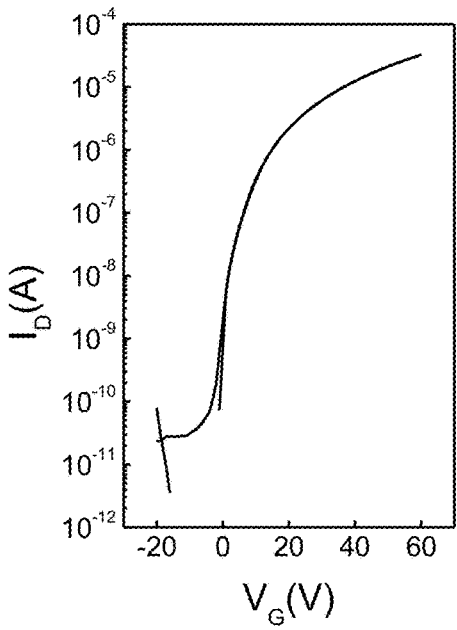
FIG. 10 shows a representative transfer plot of a top-gate bottom-contact $PDICN_2$-based OFET incorporating a dielectric layer according to the present teachings, where the LPDCPD dielectric layer was cured for 10 minutes at 150° C. The device has a thermally evaporated Au channel (50 μm x 500 μm).

Typical transfer characteristics for the above-described devices are given in FIG. 10, with typical mobilities ~1 cm²/Vs.

Figure 11:
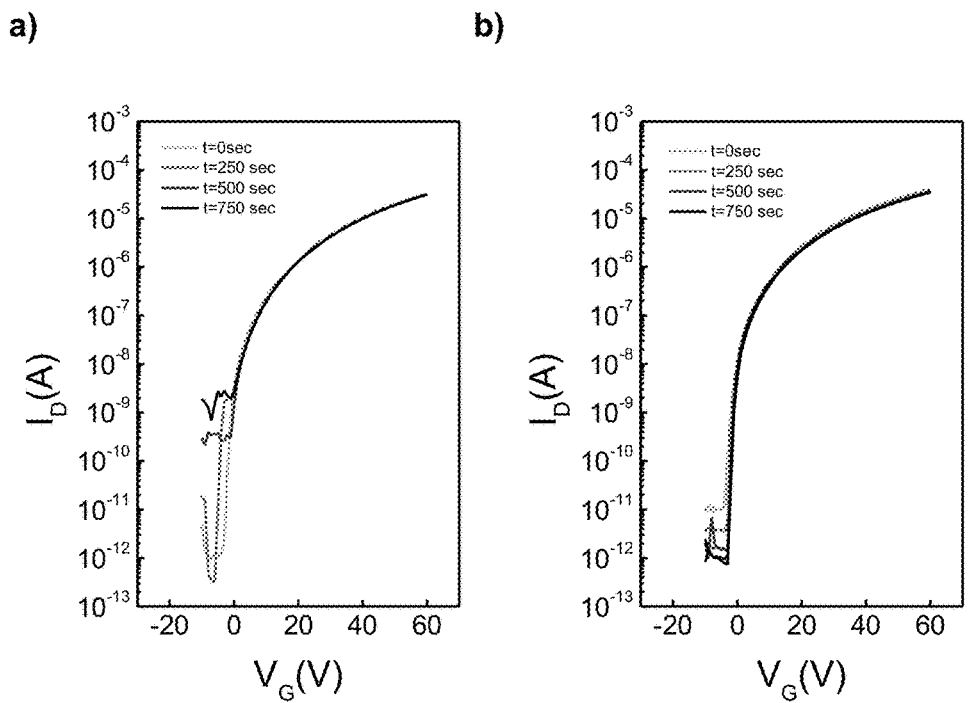
FIG. 11 shows representative transfer plots summarizing (a) NTBS and (b) PTBS measurements carried out at 60° C. in ambient conditions for a top-gate bottom-contact $PDICN_2$-based OFET incorporating a dielectric layer according to the present teachings.

Using the devices fabricated, temperature bias stress measurements were obtained at a temperature of 60° C. Results are compiled in FIG. 11. As shown, no significant threshold shift or loss of mobility was observed for either negative thermal bias stress (NTBS) or positive thermal bias stress (PTBS).

Example 11: Bottom-Gate OTFT Devices Including an LPDCPD Dielectric Layer

Bottom-gate bottom-contact OTFTs were fabricated using LPDCPD as the gate dielectric material. Silver gate electrode was vapor-deposited through a stencil mask on -polyethylene naphthalate substrates. An LPDCPD solution in toluene (80 mg/ml) was spin-coated at 1200 r.p.m. and thermally crosslinked at 150° C. for 30 minutes to provide films having a thickness of about 520 nm. The capacitance of these LPDCPD dielectric films was measured to be about 6.5 nF/cm² using metal/insulator/metal structures. Silver was vapor-deposited and source and drain contacts were patterned by classical photolithography process. The channel lengths and widths are 10 μm and 500 μm, respectively. A PDICN$_2$-based semiconductor layer (80 nm) was deposited by spin-coating. The OSC layer was annealed for 5 minutes at 120° C. to remove solvent residues.

Figure 12:
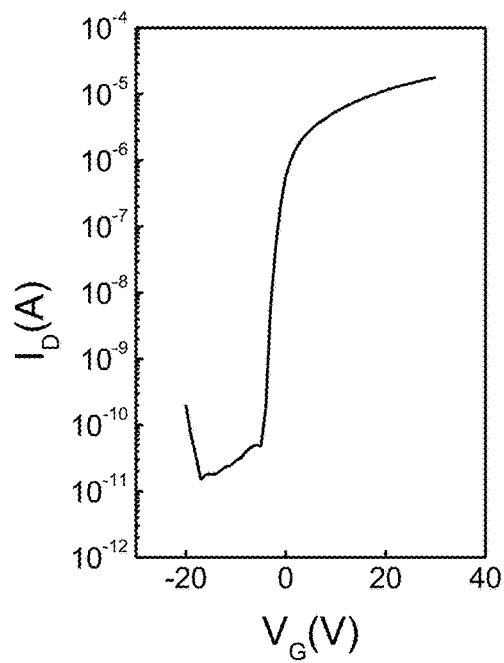
FIG. 12 shows a representative transfer plot of a bottom-gate bottom-contact $PDI-CN_2$-based OFET incorporating a dielectric layer according to the present teachings, where the LPDCPD dielectric layer (520 nm) was cured for 30 minutes at 150° C.

Typical transfer characteristics for the above-described devices are given in FIG. 12, with typical mobilities ~0.2 cm$^2$/Vs, turn-on voltage of 0~−5 V, and on/off current ratio of $10^6$.

Example 12: Top-Gate IGZO TFT Devices Including an LPDCPD Dielectric Layer

Top-gate bottom-contact IGZO TFTs were fabricated on ITO-coated glass substrates. ITO was patterned using classical lithography process. The fabricated devices have channel length and width of 10 µm and 1000 µm, respectively. IGZO was spin-coated and annealed at about 350° C. An LPDCPD solution in toluene (80 mg/ml) was spin-coated at 1000 r.p.m. onto the IGZO semiconductor to serve as the dielectric layer. The LPDCPD films were annealed at 150° C. for 10 min. Devices were completed by thermally evaporating a 50 nm thick gold gate electrode.

Figure 13:
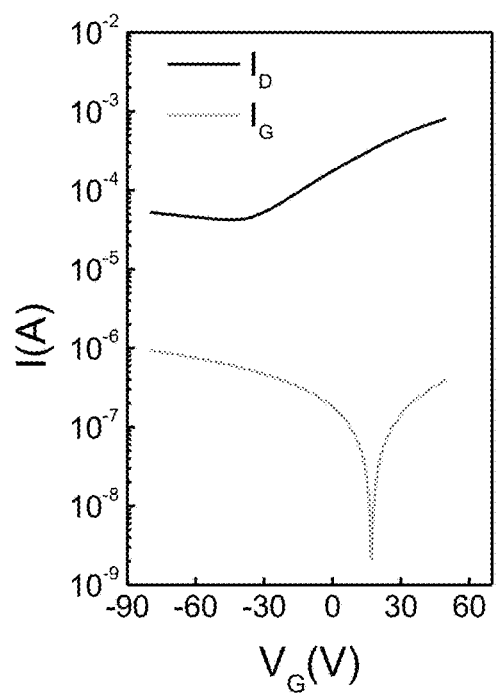
FIG. 13 shows a representative transfer plot of a top-gate bottom-contact IGZO field effect transistor incorporating a dielectric layer according to the present teachings, where the LPDCPD dielectric layer was cured for 10 minutes at 150° C.

Typical transfer characteristics for the above-described devices are given in FIG. 13, with typical mobilities ~3.7 cm$^2$/Vs.

Example 13: OTFT Devices Incorporating LPDCPD as an Additive in the OSC Layer Top-gate bottom-contact OTFTs were fabricated on glass. Substrates were cleaned with acetone and 2-propanol in an ultrasonic bath for 15 minutes each. A polymeric buffer layer (50 nm) was spin-coated onto the substrates to improve OSC wetting and crystallization. After deposition, the film was crosslinked by UV irradiation (370 nm, 4000 mJ). A 50 nm Au layer was thermally evaporated through a shadow mask to form source and drain electrodes. The fabricated devices have a channel length and width of 50 µm and 500 µm, respectively. Prior to OSC deposition, 2-methylbenzenethiol (10% vol in anisole) was grafted on the electrodes for 5 minutes to modify the gold work function. A blend formulation including a 6:4 w/w mixture of a PDICN$_2$-based semiconducting compound and LPDCPD was deposited by spin-coating to provide an ~100 nm-thick layer. The OSC layer was annealed for 5 minutes at 120° C. to remove solvent residues. A bilayer dielectric was deposited by consecutively spin-coating two different dielectric polymer formulations. The device was completed by thermal evaporation of a 50 nm-thick Au gate electrode.

Figure 14:
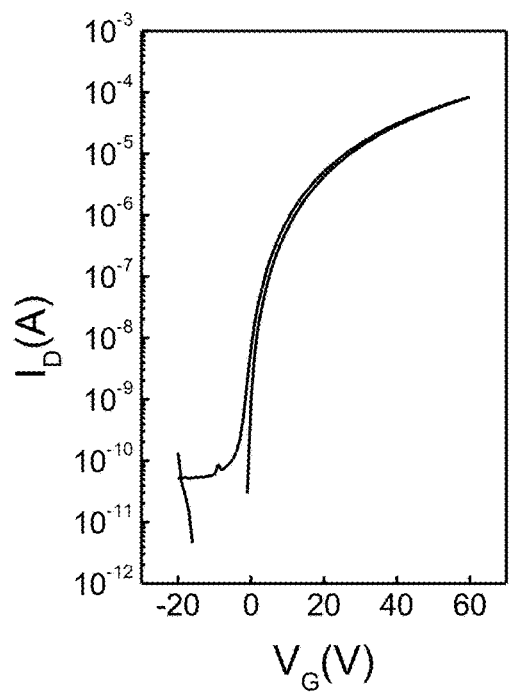
FIG. 14 shows a representative transfer plot of a top-gate bottom-contact $PDICN_2$-based OFET, where a linear polymer according to the present teachings was incorporated into the OSC layer as an additive.

Typical transfer characteristics for the above-described devices are given in FIG. 14, with typical mobilities ~2 cm$^2$/Vs.

Example 14: OTFT Devices Incorporating LPDCPD as an Encapsulation Layer

Top-gate bottom-contact OTFTs were fabricated on glass. Substrates were cleaned with acetone and 2-propanol in an ultrasonic bath for 15 minutes each. A polymeric buffer layer (50 nm) was spin-coated onto the substrates to improve OSC wetting and crystallization. After deposition, the film was crosslinked by UV irradiation (370 nm, 4000 mJ). A 50 nm Au layer was thermally evaporated through a shadow mask to form source and drain electrodes. The fabricated devices have a channel length and width of 50 µm and 500 µm, respectively. Prior to OSC deposition, 2-methylbenzenethiol (10% vol in anisole) was grafted on the electrodes for 5 minutes to modify the gold work function. A PDICN$_2$-based semiconductor layer (80 nm) was deposited by spin-coating. The OSC layer was annealed for 5 minutes at 120° C. to remove solvent residues. A bilayer dielectric was deposited by consecutively spin-coating two different dielectric polymer formulations. The device was completed by thermal evaporation of a 50 nm-thick Au gate electrode.

Figure 15:
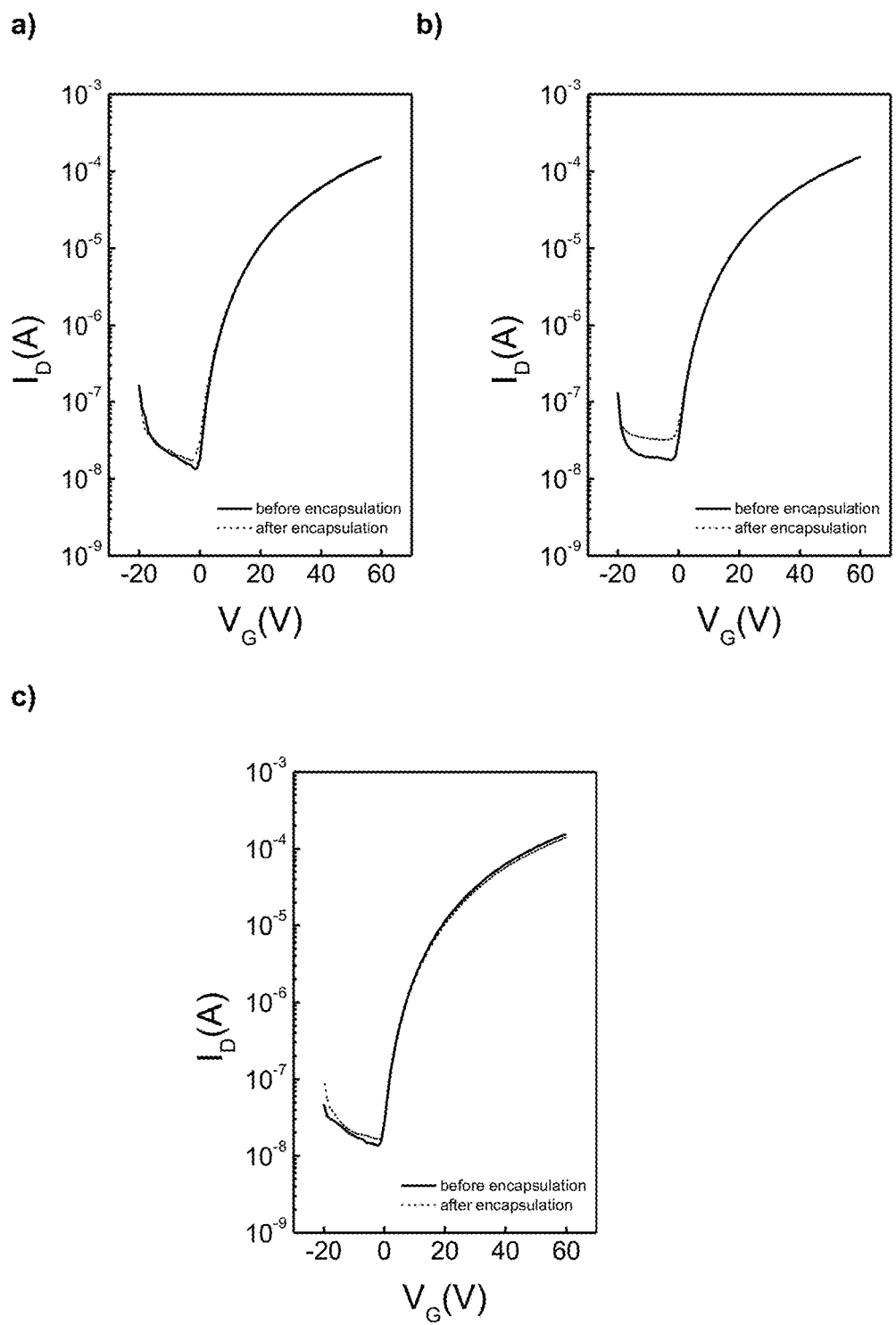
FIG. 15 shows representative transfer plots of top-gate bottom-contact $PDI-CN_2$ based OFETs before and after encapsulation, where the encapsulation layer is (a) uncrosslinked, (b) photocrosslinked, or (c) thermally crosslinked.

Standard TFT measurements were obtained for the pre-encapsulation devices described above. After measurements, a solution of LPDCPD (80 mg) and 1-chloro-4-propoxy-9H-thioxanthen-9-one (4 mg) in 1 ml cyclooctane was spin-coated over the TFT stack at 1000 r.p.m. for 30 seconds. Devices were divided into three groups. A first group of the devices were exposed to UV light to induce photo-crosslinking of the encapsulation layer. Specifically, the devices were exposed to UV light passing through a UV filter at about 370 nm for a dose of about 1800 mJ/cm$^2$. A second group of the devices were baked on a hot plate at about 150° C. for about 10 minutes to induce thermal crosslinking of the encapsulation layer. A third group of the devices were left 'as is' without further post-encapsulation treatment as the uncrosslinked controls. Typical transfer characteristics before and after encapsulation of all three groups of devices are provided in FIG. 15.

Example 15: Epoxidation of Linear Poly(dicyclopentadiene)

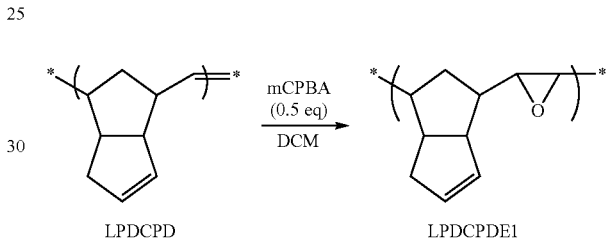

Synthesis of LPDCPDE1: To a solution of LPDCPD (1.0 g, 7.68 mmol) in dichloromethane (25 ml) was added dropwise a solution of mCPBA (1.92 g, 7.80 mmol) in dichloromethane (16 ml). After completion of the addition, the mixture was stirred for 3h. The resulting white precipitate was filtered off and the filtrate was precipitated to 100 ml of AcOEt. The white solid was collected by filtration and dried under high vacuum at room temperature for 2 days to give a solid (800 mg, yield 70%). $^1$H NMR (CDCl$_3$, 500 MHz): δ=5.82 (br m, 1H), 5.70-5.34 (br m, 1H), 3.46-3.16 (br m, 1H), 3.07-1.10 (br m, 9H).

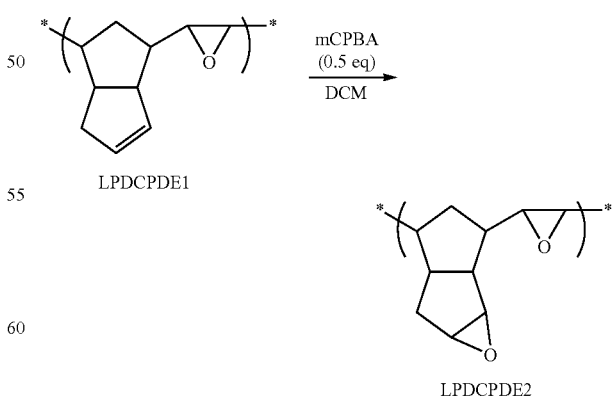

Synthesis of LPDCPDE2 from LPDCPDE1: To a solution of LPDCPDE1 (1.14 g, 7.68 mmol) in dichloromethane (40 ml) was added dropwise a solution of mCPBA (1.92 g, 7.80 mmol) in dichloromethane (16 ml). After completion of the addition, the mixture was stirred for 3h. The white precipitate was filtered off and the filtrate was precipitated to 100 ml of AcOEt. The white solid was collected by filtration and dried under high vacuum at room temperature for 2 days to give a solid (1.07 g, yield 85%). NMR showed multiple broad peaks between 3.80-1.50 ppm only.

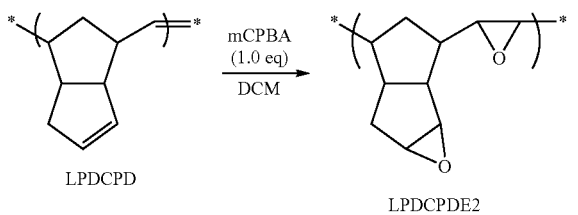

Synthesis of LPDCPDE2 from LPDCPD: To a solution of LPDCPD (5.0 g, 38.4 mmol) in dichloromethane (200 ml) was added dropwise a solution of mCPBA (19.2 g, 78.0 mmol) in dichloromethane (150 ml). After completion of the addition, the mixture was stirred for 3h. The white precipitate was filtered off and the filtrate was precipitated to 400 ml of AcOEt. The white solid was collected by filtration and dried under high vacuum at room temperature for 2 days. NMR showed multiple broad peaks between 3.80-1.50 ppm only.

Example 16: Photocrosslinking of LPCDPDE2

A solution of LPCDPDE2 (50 mg/ml) in cyclopentanone (CP) with different PAGs were spin-coated at 800 rpm for 60s on silicon dioxide. The spin-coated films were prebaked at 110° C. for 2 min, then UV exposed for 435 mJ. Following the UV exposure, the films were baked again at different temperatures for 5 minutes and then subjected to a dipping test.

The dipping test involves immersing the thin films in CP for 20 min and after air-drying, checking the difference in film thickness before and after immersion. A change in film thickness less than 5% would indicate sufficient crosslinking (indicated as "Pass" in Table 6 below).

TABLE 6

| PAGs | UV-Vis | Post exposure baking at various temperature and dipping test result | | | |
|---|---|---|---|---|---|
| | | RT | 110° C. | 135° C. | 150° C. |
| PAG 121 (1 wt %) | G&H line | No | No | No | Pass |
| PAG 290 (1 wt %) | I line | No | No | Pass | Pass |
| CGI 1907 (1 wt %) | Flat UV | No | Pass | Pass | Pass |

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electronic device comprising a field-effect transistor having a semiconductor layer comprising a semiconducting electronic material, a dielectric layer comprising an insulating electronic material, and source, drain, and gate electrodes each comprising a conducting electronic material, wherein the field-effect transistor comprises an organic material comprising a ring-opening metathesis polymerization (ROMP) polymer; wherein:
   the ROMP polymer is a linear polymer characterized by unsaturated bonds in the backbone and is obtained via ring-opening metathesis polymerization from an optionally substituted norbornene monomer, an optionally substituted dicyclopentadiene monomer, or a heteroatom derivative thereof; and wherein at least some of the unsaturated bonds in the backbone of the linear polymer are either hydrogenated, oxidized or epoxidized; and
   either the dielectric layer comprises the organic material as the insulating electronic material, or the organic material is in contact with at least one of the semiconducting electronic material, the insulating electronic material, and the conducting electronic material.

2. The electronic device of claim 1, wherein the ROMP polymer is a linear polymer characterized by unsaturated bonds in the backbone and is obtained via ring-opening metathesis polymerization from an optionally substituted norbornene monomer.

3. The electronic device of claim 1, wherein the ROMP polymer is a linear polymer characterized by unsaturated bonds in the backbone and is obtained via ring-opening metathesis polymerization from a heteroatom derivative of an optionally substituted norbornene monomer.

4. The electronic device of claim 1, wherein the ROMP polymer is a linear polymer characterized by unsaturated bonds in the backbone and is obtained via ring-opening metathesis polymerization from an optionally substituted dicyclopentadiene monomer.

5. The electronic device of claim 1, wherein the ROMP polymer is a linear polymer characterized by unsaturated bonds in the backbone and is obtained via ring-opening metathesis polymerization from a heteroatom derivative of an optionally substituted dicyclopentadiene monomer.

6. The electronic device of claim 1, wherein no more than 50% of the unsaturated bonds in the backbone of the linear polymer are hydrogenated.

7. The electronic device of claim 1, wherein some of the unsaturated bonds in the backbone of the linear polymer are oxidized.

8. The electronic device of claim 1, wherein some of the unsaturated bonds in the backbone of the linear polymer are epoxidized.

9. The electronic device of claim 1, wherein the dielectric layer comprises the organic material as the insulating electronic material.

10. The electronic device of claim 1, wherein the organic material is in contact with the semiconducting electronic material.

11. The electronic device of claim 1, wherein the organic material is in contact with the insulating electronic material.

12. The electronic device of claim 1, wherein the organic material is in contact with the conducting electronic material.

* * * * *